US009687874B2

(12) United States Patent
Ogura et al.

(10) Patent No.: US 9,687,874 B2
(45) Date of Patent: Jun. 27, 2017

(54) MULTI-STORY SUBSTRATE TREATING APPARATUS WITH FLEXIBLE TRANSPORT MECHANISMS AND VERTICALLY DIVIDED TREATING UNITS

(71) Applicant: Screen Semiconductor Solutions Co., Ltd., Kyoto (JP)

(72) Inventors: Hiroyuki Ogura, Kyoto (JP); Tsuyoshi Mitsuhashi, Kyoto (JP); Yoshiteru Fukutomi, Kyoto (JP); Kenya Morinishi, Kyoto (JP); Yasuo Kawamatsu, Kyoto (JP); Hiromichi Nagashima, Kyoto (JP)

(73) Assignee: Screen Semiconductor Solutions Co., Ltd., Kyoto (JP)

( * ) Notice: Subject to any disclaimer, the term of this patent is extended or adjusted under 35 U.S.C. 154(b) by 0 days.

(21) Appl. No.: 14/863,375

(22) Filed: Sep. 23, 2015

(65) Prior Publication Data

US 2016/0008841 A1    Jan. 14, 2016

Related U.S. Application Data

(63) Continuation of application No. 12/324,802, filed on Nov. 26, 2008, now Pat. No. 9,184,071.

(30) Foreign Application Priority Data

Nov. 30, 2007  (JP) ................................. 2007-310677

(51) Int. Cl.
*B05C 11/00* (2006.01)
*B05C 13/00* (2006.01)
(Continued)

(52) U.S. Cl.
CPC ................ *B05C 13/00* (2013.01); *B05C 9/12* (2013.01); *B05C 11/08* (2013.01); *G03F 7/16* (2013.01);
(Continued)

(58) Field of Classification Search
None
See application file for complete search history.

(56) References Cited

U.S. PATENT DOCUMENTS 4,409,889 A   10/1983  Burleson
4,985,722 A   1/1991   Ushijima et al.
(Continued)

FOREIGN PATENT DOCUMENTS

CN        1773672         5/2006
JP    H01-241840 A1       9/1989
(Continued)

OTHER PUBLICATIONS

U.S. Appl. No. 15/047,056, filed Feb. 18, 2016 by Ogura et al. (Unpublished.).
(Continued)

*Primary Examiner* — Binu Thomas
(74) *Attorney, Agent, or Firm* — Kilpatrick Townsend & Stockton LLP

(57) ABSTRACT

A substrate treating apparatus includes a first treating block and a second treating block disposed adjacent to the first treating block. Each of the first treating block and the second treating block include a plurality of stories arranged vertically. Each of the plurality of stories includes treating units for treating substrates and a main transport mechanism for transporting the substrates to and from the treating units. The substrates are transportable between the stories of the first treating block and the stories of the second treating block at same heights as corresponding stories of the first treating block. The substrates are transportable between the stories of the first treating block and the stories of the second treating block at different heights from corresponding stories of the first treating block.

4 Claims, 19 Drawing Sheets

(51) Int. Cl.
  *H01L 21/306* (2006.01)
  *H01L 21/677* (2006.01)
  *H01L 21/67* (2006.01)
  *B05C 9/12* (2006.01)
  *B05C 11/08* (2006.01)
  *G03F 7/16* (2006.01)
  *C23C 14/56* (2006.01)
  *B05C 13/02* (2006.01)

(52) U.S. Cl.
  CPC .. *H01L 21/67173* (2013.01); *H01L 21/67178* (2013.01); *H01L 21/67276* (2013.01); *H01L 21/67703* (2013.01); *H01L 21/67742* (2013.01); *H01L 21/67745* (2013.01); *B05C 13/02* (2013.01); *C23C 14/568* (2013.01); *Y10S 414/135* (2013.01)

(56) References Cited

U.S. PATENT DOCUMENTS

| | | |
|---|---|---|
| 5,028,195 A | 7/1991 | Ishii et al. |
| 5,100,516 A | 3/1992 | Nishimura et al. |
| 5,102,283 A | 4/1992 | Balzola Elora |
| 5,177,514 A | 1/1993 | Ushijima et al. |
| 5,202,716 A | 4/1993 | Tateyama et al. |
| 5,275,709 A | 1/1994 | Anderle et al. |
| 5,297,910 A | 3/1994 | Yoshioka et al. |
| 5,430,271 A | 7/1995 | Orgami et al. |
| 5,518,542 A | 5/1996 | Matsukawa et al. |
| 5,536,128 A | 7/1996 | Shimoyashiro et al. |
| 5,565,034 A | 10/1996 | Nanbu et al. |
| 5,571,325 A | 11/1996 | Ueyama et al. |
| 5,651,823 A | 7/1997 | Parodi et al. |
| 5,664,254 A | 9/1997 | Ohkura et al. |
| 5,668,056 A | 9/1997 | Wu et al. |
| 5,668,733 A | 9/1997 | Morimoto et al. |
| 5,672,205 A | 9/1997 | Fujimoto et al. |
| 5,677,758 A | 10/1997 | McEachern et al. |
| 5,725,664 A | 3/1998 | Nanbu et al. |
| 5,788,447 A | 8/1998 | Yonemitsu et al. |
| 5,788,868 A | 8/1998 | Itaba et al. |
| 5,803,932 A | 9/1998 | Akimoto et al. |
| 5,820,679 A | 10/1998 | Yokoyama et al. |
| 5,826,129 A | 10/1998 | Hasebe et al. |
| 5,842,917 A | 12/1998 | Soung et al. |
| 5,844,662 A | 12/1998 | Akimoto et al. |
| 5,858,863 A | 1/1999 | Yokoyama et al. |
| 5,876,280 A | 3/1999 | Kitano et al. |
| 5,928,390 A | 7/1999 | Yaeggashi et al. |
| 5,937,223 A | 8/1999 | Akimoto et al. |
| 5,962,070 A | 10/1999 | Mitsuhashi et al. |
| 5,963,753 A | 10/1999 | Ohtani et al. |
| 5,972,110 A | 10/1999 | Akimoto |
| 5,976,199 A | 11/1999 | Wu et al. |
| 6,007,629 A | 12/1999 | Ohtani et al. |
| 6,010,570 A | 1/2000 | Motoda et al. |
| 6,027,262 A | 2/2000 | Akimoto |
| 6,062,798 A | 5/2000 | Muka |
| 6,063,439 A | 5/2000 | Semba et al. |
| 6,069,096 A | 5/2000 | Nishihata et al. |
| 6,099,598 A | 8/2000 | Yokoyama et al. |
| 6,099,643 A | 8/2000 | Ohtani et al. |
| 6,116,841 A | 9/2000 | Iwasaki |
| 6,146,083 A | 11/2000 | Iwasaki |
| 6,151,981 A | 11/2000 | Costa |
| 6,161,969 A | 12/2000 | Kimura et al. |
| 6,176,667 B1 | 1/2001 | Fairbairn et al. |
| 6,210,481 B1 | 4/2001 | Sakai et al. |
| 6,227,786 B1 | 5/2001 | Tateyama |
| 6,235,634 B1 | 5/2001 | White et al. |
| 6,264,748 B1 | 7/2001 | Kuriki et al. |
| 6,266,125 B1 | 7/2001 | Fukuda et al. |
| 6,270,306 B1 | 8/2001 | Otwell et al. |
| 6,287,023 B1 | 9/2001 | Yaegashi et al. |
| 6,287,025 B1 | 9/2001 | Matsuyama |
| 6,290,405 B1 | 9/2001 | Ueda |
| 6,333,003 B1 | 12/2001 | Katano et al. |
| 6,338,582 B1 | 1/2002 | Ueda |
| 6,377,329 B1 | 4/2002 | Takekuma |
| 6,382,849 B1 | 5/2002 | Sakamoto et al. |
| 6,382,895 B1 | 5/2002 | Konishi et al. |
| 6,402,401 B1 | 6/2002 | Ueda et al. |
| 6,426,303 B1 | 7/2002 | Ueda |
| 6,432,842 B2 | 8/2002 | Akimoto et al. |
| 6,444,029 B1 | 9/2002 | Kimura et al. |
| 6,454,472 B1 | 9/2002 | Kim et al. |
| 6,461,438 B1 | 10/2002 | Ookura et al. |
| 6,464,789 B1 | 10/2002 | Akimoto |
| 6,466,300 B1 | 10/2002 | Deguchi |
| 6,485,203 B2 | 11/2002 | Katano et al. |
| 6,491,451 B1 | 12/2002 | Stanley et al. |
| 6,511,315 B2 | 1/2003 | Hashimoto |
| 6,537,835 B2 | 3/2003 | Adachi et al. |
| 6,558,053 B2 | 5/2003 | Shigemori et al. |
| 6,590,634 B1 | 7/2003 | Nishi et al. |
| 6,645,880 B1 | 11/2003 | Shigemori et al. |
| 6,680,775 B1 | 1/2004 | Hirikawa |
| 6,698,944 B2 | 3/2004 | Fujita |
| 6,750,155 B2 | 6/2004 | Halsey et al. |
| 6,752,543 B2 | 6/2004 | Fukutomi et al. |
| 6,752,872 B2 | 6/2004 | Inada et al. |
| 6,758,647 B2 | 7/2004 | Kaji et al. |
| 6,807,455 B2 | 10/2004 | Yoshida et al. |
| 6,832,863 B2 | 12/2004 | Sugimoto et al. |
| 6,879,866 B2 | 4/2005 | Tel et al. |
| 6,889,014 B2 | 5/2005 | Takano |
| 6,893,171 B2 | 5/2005 | Fukutomi et al. |
| 6,910,497 B2 | 6/2005 | Bernad |
| 6,919,001 B2 | 7/2005 | Fairbairn et al. |
| 6,937,917 B2 | 8/2005 | Akiyama et al. |
| 6,955,595 B2 | 10/2005 | Kim |
| 6,982,102 B2 | 1/2006 | Inada et al. |
| 7,001,674 B2 | 2/2006 | Irie |
| 7,008,124 B2 | 3/2006 | Miyata |
| 7,017,658 B2 | 3/2006 | Hisai et al. |
| 7,053,990 B2 | 5/2006 | Galburt et al. |
| 7,069,099 B2 | 6/2006 | Hashinoki et al. |
| 7,072,730 B2 | 7/2006 | Kobayashi et al. |
| 7,241,061 B2 | 7/2007 | Akimoto et al. |
| 7,245,348 B2 | 7/2007 | Akimoto et al. |
| 7,262,829 B2 | 8/2007 | Hayashida et al. |
| 7,279,067 B2 | 10/2007 | Yoshida et al. |
| 7,281,869 B2 | 10/2007 | Akimoto et al. |
| 7,317,961 B2 | 1/2008 | Hashinoki et al. |
| 7,322,756 B2 | 1/2008 | Akimoto et al. |
| 7,323,060 B2 | 1/2008 | Yamada et al. |
| 7,335,090 B2 | 2/2008 | Takahashi |
| 7,497,633 B2 | 3/2009 | Kaneyama et al. |
| 7,522,823 B2 | 4/2009 | Fukumoto et al. |
| 7,525,650 B2 | 4/2009 | Shiga et al. |
| 7,537,401 B2 | 5/2009 | Kim et al. |
| 7,549,811 B2 | 6/2009 | Yamada et al. |
| 7,563,042 B2 | 7/2009 | Nakaharada et al. |
| 7,604,424 B2 | 10/2009 | Shigemori et al. |
| 7,641,405 B2 | 1/2010 | Fukutomi |
| 7,641,406 B2 | 1/2010 | Nishimura et al. |
| 7,645,081 B2 | 1/2010 | Hara et al. |
| 7,651,306 B2 | 1/2010 | Rice et al. |
| 7,652,276 B2 | 1/2010 | Hayakawa et al. |
| 7,661,894 B2 | 2/2010 | Matsuoka et al. |
| 7,675,048 B2 | 3/2010 | Binns et al. |
| 7,686,559 B2 | 3/2010 | Tsujimoto et al. |
| 7,692,764 B2 | 4/2010 | Shirata |
| 7,699,021 B2 | 4/2010 | Volfovski et al. |
| 7,729,798 B2 | 6/2010 | Hayashida et al. |
| 7,758,341 B2 | 7/2010 | Dong-Hun |
| 7,801,633 B2 | 9/2010 | Yamamoto et al. |
| 7,809,460 B2 | 10/2010 | Ishida et al. |
| 7,819,079 B2 | 10/2010 | Englhardt et al. |
| 7,836,845 B2 | 11/2010 | Tanoue et al. |
| 7,841,072 B2 | 11/2010 | Matsuoka et al. |
| 7,871,211 B2 | 1/2011 | Matsuoka et al. |
| 7,905,668 B2 | 3/2011 | Yamamoto |

(56) References Cited

U.S. PATENT DOCUMENTS

| | | |
|---|---|---|
| 7,925,377 B2 | 4/2011 | Ishikawa et al. |
| 7,934,880 B2 | 5/2011 | Hara et al. |
| 8,025,023 B2 | 9/2011 | Hayashida et al. |
| 8,034,190 B2 | 10/2011 | Yasuda et al. |
| 8,113,141 B2 | 2/2012 | Oh |
| 8,113,142 B2 | 2/2012 | Oh |
| 8,154,106 B2 | 4/2012 | Ishida et al. |
| 8,220,354 B2 | 7/2012 | Todorov |
| 8,268,384 B2 | 9/2012 | Matshuoka et al. |
| 8,289,496 B2 | 10/2012 | Kim et al. |
| 8,342,761 B2 | 1/2013 | Matsuoka |
| 8,353,986 B2 | 1/2013 | Sasaski et al. |
| 8,419,341 B2 | 4/2013 | Hoey et al. |
| 8,443,513 B2 | 5/2013 | Ishida et al. |
| 8,480,319 B2 | 7/2013 | Hayashi et al. |
| 8,545,118 B2 | 10/2013 | Ogura et al. |
| 8,560,108 B2 | 10/2013 | Matsuyana et al. |
| 8,588,950 B2 | 11/2013 | Nomura |
| 8,612,807 B2 | 12/2013 | Collins, Jr. |
| 8,631,809 B2 | 1/2014 | Hamada et al. |
| 8,708,587 B2 | 4/2014 | Ogura et al. |
| 8,731,701 B2 | 5/2014 | Tsukinoki et al. |
| 8,851,008 B2 | 10/2014 | Fukutomi et al. |
| 9,165,807 B2 | 10/2015 | Fukutomi et al. |
| 9,174,235 B2 | 11/2015 | Fukutomi et al. |
| 9,184,071 B2 | 11/2015 | Ogura et al. |
| 9,230,834 B2 | 1/2016 | Fukutomi et al. |
| 2001/0013161 A1 | 8/2001 | Kitano et al. |
| 2001/0013515 A1 | 8/2001 | Harada et al. |
| 2001/0031147 A1 | 10/2001 | Takamori et al. |
| 2002/0011207 A1 | 1/2002 | Uzawa et al. |
| 2002/0048509 A1 | 4/2002 | Sakata et al. |
| 2002/0053319 A1 | 5/2002 | Nagamine |
| 2002/0176936 A1 | 11/2002 | Matsuyama |
| 2003/0079957 A1 | 5/2003 | Otaguro et al. |
| 2003/0098966 A1 | 5/2003 | Korenaga et al. |
| 2003/0131458 A1 | 7/2003 | Wang et al. |
| 2003/0147643 A1 | 8/2003 | Miyata et al. |
| 2003/0213431 A1 | 11/2003 | Fukutomi et al. |
| 2003/0216053 A1 | 11/2003 | Miyata |
| 2003/0217695 A1 | 11/2003 | Fukutomi et al. |
| 2004/0005149 A1 | 1/2004 | Sugimoto et al. |
| 2004/0007176 A1 | 1/2004 | Janakiraman et al. |
| 2004/0050321 A1 | 3/2004 | Kitano et al. |
| 2004/0061065 A1 | 4/2004 | Hashimoto et al. |
| 2004/0122545 A1 | 6/2004 | Akiyama et al. |
| 2004/0182318 A1 | 9/2004 | Hashinoki et al. |
| 2004/0229441 A1 | 11/2004 | Sugimoto et al. |
| 2005/0030511 A1 | 2/2005 | Auer-Jongepier et al. |
| 2005/0042555 A1 | 2/2005 | Matsushita et al. |
| 2005/0058775 A1 | 3/2005 | Oku et al. |
| 2005/0061441 A1 | 3/2005 | Hashinoki et al. |
| 2005/0069400 A1 | 3/2005 | Dickey et al. |
| 2005/0135905 A1 | 6/2005 | Moriya et al. |
| 2005/0266323 A1 | 12/2005 | Raulea |
| 2006/0011296 A1 | 1/2006 | Higashi et al. |
| 2006/0024446 A1 | 2/2006 | Sugimoto et al. |
| 2006/0028630 A1 | 2/2006 | Akimoto |
| 2006/0062282 A1 | 3/2006 | Wright |
| 2006/0090849 A1 | 5/2006 | Toyoda et al. |
| 2006/0098978 A1 | 5/2006 | Yasuda et al. |
| 2006/0104635 A1 | 5/2006 | Kaneyama et al. |
| 2006/0134330 A1 | 6/2006 | Ishikawa et al. |
| 2006/0137726 A1 | 6/2006 | Sano et al. |
| 2006/0147202 A1 | 7/2006 | Yasuda et al. |
| 2006/0162858 A1 | 7/2006 | Akimoto et al. |
| 2006/0164613 A1 | 7/2006 | Akimoto et al. |
| 2006/0194445 A1 | 8/2006 | Hayashi et al. |
| 2006/0201423 A1 | 9/2006 | Akimoto et al. |
| 2006/0201615 A1 | 9/2006 | Matsuoka et al. |
| 2006/0219171 A1 | 10/2006 | Sasaki et al. |
| 2006/0286300 A1 | 12/2006 | Ishikawa et al. |
| 2007/0048979 A1 | 3/2007 | Fukuoka et al. |
| 2007/0056514 A1 | 3/2007 | Akimoto et al. |
| 2007/0058147 A1 | 3/2007 | Hamada |
| 2007/0119479 A1 | 5/2007 | Yoshihara et al. |
| 2007/0128529 A1 | 6/2007 | Kazaana |
| 2007/0172234 A1 | 7/2007 | Shigemori et al. |
| 2007/0179658 A1 | 8/2007 | Hamada |
| 2007/0190437 A1 | 8/2007 | Kaneyama et al. |
| 2007/0219660 A1 | 9/2007 | Kaneko et al. |
| 2007/0274711 A1 | 11/2007 | Kaneyama et al. |
| 2007/0280680 A1 | 12/2007 | Kim et al. |
| 2007/0297794 A1 | 12/2007 | Park et al. |
| 2008/0014333 A1 | 1/2008 | Matsuoka et al. |
| 2008/0026153 A1 | 1/2008 | Hayashida et al. |
| 2008/0037013 A1 | 2/2008 | Yamamoto et al. |
| 2008/0070164 A1 | 3/2008 | Hayashida et al. |
| 2008/0129968 A1 | 6/2008 | Hayashida et al. |
| 2008/0158531 A1 | 7/2008 | Kiuchi |
| 2008/0212049 A1 | 9/2008 | Fukutomi et al. |
| 2008/0224817 A1 | 9/2008 | Vellore et al. |
| 2008/0241403 A1* | 10/2008 | Matsuoka ......... H01L 21/67178 118/697 |
| 2008/0269937 A1 | 10/2008 | Yamamoto |
| 2008/0304940 A1 | 12/2008 | Auer-Jongepier et al. |
| 2009/0000543 A1 | 1/2009 | Fukutomi et al. |
| 2009/0001071 A1 | 1/2009 | Kulkarni |
| 2009/0014126 A1 | 1/2009 | Ohtani et al. |
| 2009/0018686 A1 | 1/2009 | Yamamoto et al. |
| 2009/0044747 A1 | 2/2009 | Nishimura |
| 2009/0060480 A1 | 3/2009 | Herchen |
| 2009/0070946 A1 | 3/2009 | Tamada et al. |
| 2009/0098298 A1 | 4/2009 | Miyata et al. |
| 2009/0130614 A1 | 5/2009 | Ookouchi et al. |
| 2009/0139833 A1 | 6/2009 | Ogura |
| 2009/0142162 A1 | 6/2009 | Ogura et al. |
| 2009/0142713 A1* | 6/2009 | Yamamoto ......... H01L 21/67225 430/325 |
| 2009/0143903 A1 | 6/2009 | Blust et al. |
| 2009/0149982 A1 | 6/2009 | Higashi et al. |
| 2009/0165711 A1 | 7/2009 | Ogura et al. |
| 2009/0165712 A1 | 7/2009 | Ogura et al. |
| 2009/0165950 A1 | 7/2009 | Kim et al. |
| 2009/0247053 A1 | 10/2009 | Lee |
| 2009/0291558 A1 | 11/2009 | Kim et al. |
| 2010/0050940 A1 | 3/2010 | Sahoda et al. |
| 2010/0061718 A1 | 3/2010 | Hara et al. |
| 2010/0126527 A1 | 5/2010 | Hamada |
| 2010/0136257 A1 | 6/2010 | Yasuda et al. |
| 2010/0183807 A1 | 7/2010 | Kim |
| 2010/0191362 A1 | 7/2010 | Tsukinoki |
| 2010/0192844 A1 | 8/2010 | Kim et al. |
| 2010/0195066 A1 | 8/2010 | Kim et al. |
| 2011/0043773 A1 | 2/2011 | Matsuoka |
| 2011/0063588 A1 | 3/2011 | Kashiyama et al. |
| 2011/0078898 A1 | 4/2011 | Ishida et al. |
| 2011/0082579 A1 | 4/2011 | Yoshida et al. |
| 2011/0208344 A1 | 8/2011 | Matsuyama et al. |
| 2011/0211825 A1 | 9/2011 | Matsuoka et al. |
| 2011/0242508 A1 | 10/2011 | Kobayashi |
| 2011/0276166 A1 | 11/2011 | Atanasoff |
| 2011/0297085 A1 | 12/2011 | Matsuyama et al. |
| 2012/0013730 A1 | 1/2012 | Koga |
| 2012/0013859 A1 | 1/2012 | Matsuoka et al. |
| 2012/0015307 A1 | 1/2012 | Matsuoka et al. |
| 2012/0029687 A1 | 2/2012 | Hagen et al. |
| 2012/0073461 A1 | 3/2012 | Terada et al. |
| 2012/0084059 A1 | 4/2012 | Akada |
| 2012/0086142 A1 | 4/2012 | Terada et al. |
| 2012/0097336 A1 | 4/2012 | Terada et al. |
| 2012/0135148 A1 | 5/2012 | Deguchi et al. |
| 2012/0145073 A1 | 6/2012 | Fukutomii et al. |
| 2012/0145074 A1 | 6/2012 | Fukutomii et al. |
| 2012/0156380 A1 | 6/2012 | Fukutomii et al. |
| 2012/0271444 A1 | 10/2012 | Matsumoto |
| 2012/0307217 A1 | 12/2012 | Kim et al. |
| 2014/0000514 A1 | 1/2014 | Ogura et al. |
| 2014/0003891 A1 | 1/2014 | Kobayashi |
| 2014/0152966 A1 | 6/2014 | Hwang et al. |

(56) References Cited

U.S. PATENT DOCUMENTS

| | | |
|---|---|---|
| 2014/0342558 A1 | 11/2014 | Ogura et al. |
| 2016/0079099 A1 | 3/2016 | Fukutomi et al. |
| 2016/0163573 A1 | 6/2016 | Ogura et al. |

FOREIGN PATENT DOCUMENTS

| | | |
|---|---|---|
| JP | H04-085812 A1 | 3/1992 |
| JP | H06-5689 A1 | 1/1994 |
| JP | H06-89934 A1 | 3/1994 |
| JP | H07-263302 A | 10/1995 |
| JP | H07-283094 A1 | 10/1995 |
| JP | H08-162514 A1 | 6/1996 |
| JP | H09-045613 A1 | 2/1997 |
| JP | H9-148240 A1 | 6/1997 |
| JP | 09-199568 | 7/1997 |
| JP | H09-213616 A | 8/1997 |
| JP | H09-251953 A1 | 9/1997 |
| JP | 09-312323 A1 | 12/1997 |
| JP | H10-50794 A1 | 2/1998 |
| JP | H10-74822 A1 | 3/1998 |
| JP | H10-144673 A1 | 5/1998 |
| JP | 10-146744 A1 | 6/1998 |
| JP | 10-209241 | 7/1998 |
| JP | H10-189420 A1 | 7/1998 |
| JP | H10-261554 A | 9/1998 |
| JP | H10-261689 A1 | 9/1998 |
| JP | H10-294351 A1 | 11/1998 |
| JP | H10-335415 A1 | 12/1998 |
| JP | H11-16978 A1 | 1/1999 |
| JP | H11-111603 A | 4/1999 |
| JP | H11-3851 A | 6/1999 |
| JP | H11-156278 A | 6/1999 |
| JP | H11-251405 A1 | 9/1999 |
| JP | 11-340301 A | 12/1999 |
| JP | 2000-012443 A1 | 1/2000 |
| JP | 2000-049089 A1 | 2/2000 |
| JP | 2000-68188 A | 3/2000 |
| JP | 2000-100886 A1 | 4/2000 |
| JP | 2000-124124 A1 | 4/2000 |
| JP | 2000-124129 A1 | 4/2000 |
| JP | 2000-200822 A1 | 7/2000 |
| JP | 2000-311846 A | 7/2000 |
| JP | 2000-269297 A1 | 9/2000 |
| JP | 2000-331922 | 11/2000 |
| JP | 2001-57334 A | 2/2001 |
| JP | 2001-102292 A | 4/2001 |
| JP | 2001-093827 A1 | 6/2001 |
| JP | 2001-176792 A1 | 6/2001 |
| JP | 03-211749 A | 9/2001 |
| JP | 2002-510141 A1 | 2/2002 |
| JP | 2002-353091 A | 12/2002 |
| JP | 2003-059810 A1 | 2/2003 |
| JP | 2003-224175 A1 | 8/2003 |
| JP | 2003-309160 A1 | 10/2003 |
| JP | 2003-324059 A1 | 11/2003 |
| JP | 2003-324139 | 11/2003 |
| JP | 2003-338496 A1 | 11/2003 |
| JP | 2004-15021 A1 | 1/2004 |
| JP | 2004-015023 A1 | 1/2004 |
| JP | 2004-31921 A1 | 1/2004 |
| JP | 2004-072061 A | 3/2004 |
| JP | 2004-087675 | 3/2004 |
| JP | 2004-146450 | 5/2004 |
| JP | 2004-152801 A1 | 5/2004 |
| JP | 2004-193597 A | 7/2004 |
| JP | 2004-200485 A1 | 7/2004 |
| JP | 2004-207279 A1 | 7/2004 |
| JP | 2004-241319 A1 | 8/2004 |
| JP | 2004-260129 | 9/2004 |
| JP | 3600711 | 9/2004 |
| JP | 2004-304003 A1 | 10/2004 |
| JP | 2004-311714 A1 | 11/2004 |
| JP | 2004-319767 A1 | 11/2004 |
| JP | 2005-46694 A | 2/2005 |
| JP | 2005-57294 A1 | 3/2005 |
| JP | 2005-093920 A1 | 4/2005 |
| JP | 2005-101078 A1 | 4/2005 |
| JP | 2005-123249 A1 | 5/2005 |
| JP | 2005-167083 A1 | 6/2005 |
| JP | 2005-210059 A | 8/2005 |
| JP | 2005-243690 A1 | 9/2005 |
| JP | 2005-303230 A | 10/2005 |
| JP | 2006-203075 | 8/2006 |
| JP | 2006-216614 A1 | 8/2006 |
| JP | 2006-228974 A1 | 8/2006 |
| JP | 2006-229183 A1 | 8/2006 |
| JP | 2006-245312 | 9/2006 |
| JP | 2006-253501 A1 | 9/2006 |
| JP | 2006-269672 A1 | 10/2006 |
| JP | 2006-287178 A1 | 10/2006 |
| JP | 2006-335484 A1 | 12/2006 |
| JP | 2007-005659 A1 | 1/2007 |
| JP | 2007-288029 A1 | 1/2007 |
| JP | 2007-067178 A1 | 3/2007 |
| JP | 2007-150064 A | 6/2007 |
| JP | 2007-150071 A1 | 6/2007 |
| JP | 2007-158260 A1 | 6/2007 |
| JP | 2007-208064 A1 | 8/2007 |
| JP | 2007-227984 | 9/2007 |
| JP | 2007-287887 A1 | 11/2007 |
| JP | 2009-99577 A1 | 5/2009 |
| JP | 2009-164256 A1 | 7/2009 |
| JP | 2006-253207 A1 | 9/2009 |
| JP | 2009-076893 A1 | 9/2009 |
| KR | 1997-0011065 A1 | 3/1997 |
| KR | 1999-0023624 A | 3/1999 |
| KR | 2001-0029862 A | 4/2001 |
| KR | 2002-0035758 A1 | 5/2002 |
| KR | 10-0387418 B1 | 6/2003 |
| KR | 10-2003-0087418 A | 11/2003 |
| KR | 2003-0086900 A | 11/2003 |
| KR | 10-2004-0054517 A | 6/2004 |
| KR | 1020050049935 A1 | 5/2005 |
| KR | 10-2005-0051280 A | 6/2005 |
| KR | 10-2006-0033423 A | 4/2006 |
| KR | 2006-0050112 A | 5/2006 |
| KR | 10-2006-0085188 A | 7/2006 |
| KR | 10-2006-0088495 A | 8/2006 |
| KR | 10-2006-0092061 A | 8/2006 |
| KR | 10-2006-0097613 A | 9/2006 |
| KR | 10-0634122 B1 | 10/2006 |
| KR | 10-2007-0007262 A | 1/2007 |
| KR | 2007-0003328 A | 1/2007 |
| KR | 10-2007-0034979 A | 3/2007 |
| KR | 10-0698352 A | 3/2007 |
| KR | 10-2007-0062522 A | 6/2007 |
| TW | 200631680 | 9/2006 |

OTHER PUBLICATIONS

Notice of Allowance for U.S. Appl. No. 12/324,802 mailed on Jun. 26, 2015, 20 pages.
Notice of Allowance for U.S. Appl. No. 14/447,409 mailed on Feb. 18, 2016, 14 pages.
Non-Final Office Action for U.S. Appl. No. 12/324,788 mailed May 27, 2011, 41 pages.
Non-Final Office Action for U.S. Appl. No. 12/163,951 mailed Jul. 11, 2011, 18 pages.
Non-Final Office Action for U.S. Appl. No. 12/343,302 mailed Aug. 19, 2011, 26 pages.
Non-Final Office Action for U.S. Appl. No. 12/343,292 mailed Oct. 28, 2011, 12 pages.
Final Office Action for U.S. Appl. No. 12/324,788 mailed Dec. 7, 2011, 26 pages.
Final Office Action for U.S. Appl. No. 12/163,951 mailed Jan. 19, 2012, 22 pages.
Non-Final Office Action for U.S. Appl. No. 12/324,794 mailed Feb. 3, 2012, 8 pages.
Final Office Action for U.S. Appl. No. 12/343,302 mailed Apr. 12, 2012, 33 pages.
Final Office Action for U.S. Appl. No. 12/343,292 mailed Jun. 1, 2012, 15 pages.

(56) References Cited

OTHER PUBLICATIONS

Advisory Action for U.S. Appl. No. 12/343,292 mailed Oct. 12, 2012, 3 pages.
Non-Final Office Action for U.S. Appl. No. 13/401,625 mailed Mar. 14, 2013, 8 pages.
Notice of Allowance for U.S. Appl. No. 12/324,794 mailed May 29, 2013, 7 pages.
Non-Final Office Action for U.S. Appl. No. 13/401,644 mailed Jun. 21, 2013, 16 pages.
Invalidation Trial for corresponding Korean Patent No. 10-1170211 dated Aug. 7, 2013, 26 pages.
U.S. Appl. No. 14/011,993, filed Aug. 28, 2013 by Ogura et al.
Final Office Action for U.S. Appl. No. 13/401,625 mailed Sep. 19, 2013, 11 pages.
Non-Final Office Action for U.S. Appl. No. 13/401,617 mailed Sep. 17, 2013, 8 pages.
Office Action for corresponding Japanese Patent Application No. 2012-118584 dated Oct. 22, 2013, 2 pages.
Notice of Allowance for U.S. Appl. No. 14/011,993 mailed Oct. 7, 2013, 11 pages.
Office Action for corresponding Japanese Patent Application No. 2011-257538, dated Dec. 3, 2013, 3 pages.
Notice of Allowance for corresponding Korean Patent Application No. 10-2012-0005204 dated Jan. 22, 2014, 3 pages.
Final Office Action for U.S. Appl. No. 13/401,644 mailed Nov. 22, 2013, 20 pages.
Restriction Requirement for U.S. Appl. No. 12/163,951 mailed Feb. 3, 2014, 7 pages.
Non-Final Office Action for U.S. Appl. No. 13/401,625 mailed on Mar. 28, 2014, 11 pages.
Supplemental Notice of Allowance for U.S. Appl. No. 14/011,993 mailed on Apr. 1, 2014, 2 pages.
Non-Final Office Action for U.S. Appl. No. 13/401,644 mailed on Apr. 4, 2014, 10 pages.
Non-Final Office Action for U.S. Appl. No. 12/324,788 mailed on Apr. 4, 2014, 30 pages.
Non-Final Office Action for U.S. Appl. No. 12/343,302 mailed on Apr. 10, 2014, 22 pages.
Restriction Requirement for U.S. Appl. No. 12/343,292 mailed on Apr. 10, 2014, 6 pages.
Machine Translation of KR 10-2006-0033423 A published Apr. 19, 2006, 14 pages.
Notice of Allowance for U.S. Appl. No. 12/163,951 mailed on Jul. 10, 2014, 9 pages.
Final Office Action for U.S. Appl. No. 13/401,617 mailed on Jun. 2, 2014, 10 pages.
U.S. Appl. No. 14/447,409, filed Jul. 30, 2014 by Ogura et al. (Unpublished.).
Advisory Action for U.S. Appl. No. 13/401,617 mailed on Nov. 7, 2014, 4 pages.
Final Office Action for U.S. Appl. No. 12/324,788 mailed on Nov. 6, 2014, 44 pages.
Final Office Action for U.S. Appl. No. 12/343,292 mailed on Nov. 5, 2014, 20 pages.
Final Office Action for U.S. Appl. No. 13/401,644 mailed on Dec. 1, 2014, 20 pages.
Non-Final Office Action for U.S. Appl. No. 13/401,625 mailed on Dec. 9, 2014, 16 pages.
Non-Final Office Action for U.S. Appl. No. 13/401,617 mailed on Feb. 2, 2015, 11 pages.
Non-Final Office Action for U.S. Appl. No. 12/343,292 mailed on Jun. 3, 2015, 25 pages.
Notice of Allowance for U.S. Appl. No. 13/401,625 mailed on Jun. 16, 2015, 15 pages.
Notice of Allowance for U.S. Appl. No. 13/401,644 mailed on Jun. 29, 2015, 15 pages.
Trial for Patent Invalidation for corresponding Korean Patent Application No. 10-1432358, dated May 22, 2015, (with English Machine Translation) 123 pages.
Notice of Allowance for U.S. Appl. No. 12/343,292, mailed on Nov. 18, 2015, 20 pages.
Notice of Allowance for U.S. Appl. No. 13/401,617, mailed on Sep. 2, 2015, 14 pages.
Notice of Allowability for U.S. Appl. No. 13/401,625, mailed on Jul. 28, 2015, 10 pages.
Notice of Allowability for U.S. Appl. No. 13/401,644, mailed on Jul. 29, 2015, 12 pages.
U.S. Appl. No. 14/952,657, filed Nov. 25, 2015 by Fukutomi et al. (Unpublished).

* cited by examiner

US 9,687,874 B2

MULTI-STORY SUBSTRATE TREATING APPARATUS WITH FLEXIBLE TRANSPORT MECHANISMS AND VERTICALLY DIVIDED TREATING UNITS

CROSS-REFERENCES TO RELATED APPLICATIONS

This application is a continuation of U.S. application Ser. No. 12/324,802, filed on Nov. 26, 2008 which claims priority to Japanese Patent Application No. JP2007-310677, filed on Nov. 30, 2007, the entire disclosures of which are hereby incorporated by reference in their entirety for all purposes.

BACKGROUND OF THE INVENTION

This invention relates to a substrate treating apparatus for performing a series of treatments of substrates such as semiconductor wafers, glass substrates for liquid crystal displays, glass substrates for photomasks, and substrates for optical disks (hereinafter called simply "substrates").

Conventionally, this type of substrate treating apparatus is used to form a resist film on substrates and develop the substrates exposed in a separate exposing machine. The apparatus includes a treating section having, arranged therein, a coating block for forming film such as resist film, a developing block for developing the substrates, and so on. Each treating block includes a single main transport mechanism and various treating units. The main transport mechanism of each treating block, while transporting substrates to the treating units in that treating block, transfers the substrates through receivers to and from the main transport mechanism of another, adjacent, treating block to carry out a series of treatments of the substrates (as disclosed in Japanese Unexamined Patent Publication No. 2003-324139, for example).

The conventional apparatus with such a construction has the following drawbacks.

In the conventional apparatus, when the main transport mechanism of one of the treating blocks breaks down or otherwise becomes unable to transport substrates (abnormal state), it becomes altogether impossible to transport the substrates to and from other, adjoining, treating blocks. Only a single route (transport path) is available for transporting the substrates between the treating blocks, and thus transporting is lacking in flexibility. Consequently, there occurs an inconvenience that the substrates cannot be treated at all even though the main transport mechanisms of the other treating blocks are in a normal condition.

SUMMARY OF THE INVENTION

This invention has been made having regard to the state of the art noted above, and its object is to provide a substrate treating apparatus that can transport substrates flexibly between adjoining treating blocks.

The above object is fulfilled, according to an embodiment of the invention, by a substrate treating apparatus comprising a plurality of treating blocks juxtaposed horizontally, each including stories of vertically divided treating units arranged for treating substrates, and a main transport mechanism provided on each of the stories for transporting the substrates to and from the treating units arranged thereon; wherein the substrates are transportable between the same stories of adjoining ones of the treating blocks, and transportable between different stories of at least a pair of adjoining ones of the treating blocks.

According to this embodiment, the substrates are transported between adjoining treating blocks, thereby allowing a series of treatments to be carried out for the substrates in parallel. A series of treatments can be carried out for the substrates also by transporting the substrates to and from a different story of at least one of the adjoining treating blocks. Thus, since this apparatus provides transport paths greater in number than the stories, the substrates can be transported flexibly. As a result, even when one of the main transport mechanisms falls into an abnormal state unable to transport the substrates, the series of treatments can be carried out for the substrates by transporting the substrates through transport paths not including this main transport mechanism.

In the embodiment noted above, the apparatus may further comprise a movable receiver for receiving the substrates, disposed between the treating blocks where the substrates are transportable between different stories, to be vertically movable to a plurality of stories. With the movable receiver vertically movable to a plurality of stories, the substrates can be transported to and from different stories between the treating blocks juxtaopposed to each other with the movable receiver in between.

In the embodiment noted above, the main transport mechanisms of the treating blocks juxtaopposed to each other with the movable receiver in between may be capable of transporting the substrates to and from the movable receiver. With the main transport mechanisms capable of transporting the substrates to and from the movable receiver, the main transport mechanisms of the treating blocks juxtaopposed to each other with the movable receiver in between can conveniently transfer the substrates to and from each other through the movable receiver.

In the embodiment noted above, the movable receiver, upon receipt of a substrate, may be movable to a story different from a story where the movable receiver has received the substrate. With the movable receiver holding a substrate and moving to a story different from a story where the movable receiver has received the substrate, the substrates can be transported between different stories of the treating blocks having the movable receiver in between.

In the embodiment noted above, the movable receiver may be movable to all the stories. In the treating blocks having the movable receiver in between, the substrates can be transported from each story of one treating block to all the stories of the other treating block. The substrates can also be transported from each story of the other treating block to all the stories of one treating block.

In the embodiment noted above, the apparatus may further comprise, arranged between the treating blocks where the substrates are transportable between different stories, a plurality of fixed receivers provided for the respective stories; and a receiver transport mechanism for transporting the substrates between the fixed receivers. With the receiver transport mechanism transporting the substrates from the fixed receiver of one story to the fixed receiver of another story, the substrates can be transported between different stories of the treating blocks having the fixed receivers and receiver transport mechanism in between.

In the embodiment noted above, the main transport mechanisms of the treating blocks juxtaopposed to each other with the fixed receivers in between may be capable of transporting the substrates to and from the fixed receivers. With the main transport mechanisms on each story being capable of transporting the substrates to and from the fixed receiver of that story, the main transport mechanisms of the treating blocks juxtaopposed to each other with the fixed receivers in between can conveniently transfer the substrates through the fixed receivers.

In the embodiment noted above, when one of the main transport mechanisms of one of the treating blocks where the substrates are transportable between different stories is in an abnormal state, each of the main transport mechanisms of the other treating block may be arranged to transfer the substrates to and from the other main transport mechanism of the one of the treating blocks. Even when the main transport mechanism on any one story is in an abnormal state, another story on the same level with this story can transport the substrates to and from different stories, and can treat the substrates. Thus, even when a main transport mechanism is in an abnormal state, it is possible to prevent a substantial reduction in the operating ratio of the entire apparatus.

In the embodiment noted above, the treating blocks where the substrates are transportable between different stories may be a coating block, and a developing block disposed adjacent the coating block. The coating block has coating units and heat-treating units as the treating units for forming resist film on the substrates, and first main transport mechanisms as the main transport mechanisms for transporting the substrates to and from the coating units and the heat-treating units. The developing block has developing units and heat-treating units as the treating units for developing the substrates, and second main transport mechanisms as the main transport mechanisms for transporting the substrates to and from the developing units and the heat-treating units. The substrates can be transported between the same stories and between different stories of the coating block and developing block. Since the substrates can be transported flexibly in this way, the substrates can conveniently receive both the treatment to form resist film thereon and the treatment to develop the substrates.

In the embodiment noted above, each story of the coating block may be capable of transporting the substrates to and from all the stories of the developing block. Then, the substrates can be transported with increased flexibility between the coating block and developing block.

In the embodiment noted above, one part of the stories of the coating block may be arranged exclusively to form resist film on the substrates and feed the substrates with resist film formed thereon toward the developing block; and another part of the stories of the coating block may be arranged exclusively to receive the substrates fed from the developing block. The substrates need not receive treatment on the story of the coating block dedicated to receiving the substrates fed from the developing block. When, for example, a treating unit of the coating block is in an abnormal state, the story having this treating unit is given a task of only receiving the substrates fed from the developing block. The efficiency of treating the substrates can be improved compared with the case where this story does not engage in substrate transport at all.

In another aspect of the invention, a substrate treating apparatus comprises a plurality of treating blocks juxtaposed horizontally, each including treating units arranged on each of stories divided vertically for treating substrates, and a main transport mechanism provided on each of the stories for transporting the substrates to and from the treating units arranged thereon; wherein the substrates are transportable between the same stories of adjoining ones of the treating blocks, and in at least a pair of adjoining ones of the treating blocks, transportable between at least one of the stories of one of the treating blocks and a different story of the other treating block.

According to an embodiment, the substrates are transported between adjoining treating blocks, thereby allowing a series of treatments to be carried out for the substrates. A series of treatments can be carried out for the substrates also by transporting the substrates to and from a different story of at least one of the adjoining treating blocks. Thus, since this apparatus provides transport paths greater in number than the stories, the substrates can be transported flexibly. As a result, even when one of the main transport mechanisms falls into an abnormal state unable to transport the substrates, the series of treatments can be carried out for the substrates by transporting the substrates through transport paths not including this main transport mechanism.

In the embodiment noted above, the main transport mechanism of the one of the stories may be constructed extendible and retractable or vertically movable to and from a plurality of stories, including the one of the stories within the one of the treating blocks, to transfer the substrates to and from the main transport mechanisms on a plurality of stories of the adjoining treating block. With the main transport mechanism extendible and retractable or vertically movable to and from a plurality of stories, this main transport mechanism can transport the substrates conveniently to and from the main transport mechanisms on different stories of the adjoining treating block.

In the embodiment noted above, the one of the stories may be capable of transporting the substrates to and from all the stories of the adjoining treating block. Then, the substrates can be transported with increased flexibility between the treating blocks.

In the embodiment noted above, the main transport mechanism of the one of the stories may be constructed extendible and retractable or vertically movable to and from all the stories within the one of the treating blocks to transfer the substrates to and from the main transport mechanisms on all the stories of the adjoining treating block. The substrates can be transported with increased flexibility between the treating blocks.

In the embodiment noted above, the treating blocks where the substrates are transportable between different stories may be a coating block and a developing block. The coating block has coating units and heat-treating units as the treating units for forming resist film on the substrates and first main transport mechanisms as the main transport mechanisms for transporting the substrates to and from the coating units and the heat-treating units. The developing block has developing units and heat-treating units as the treating units for developing the substrates and second main transport mechanisms as the main transport mechanisms for transporting the substrates to and from the developing units and the heat-treating units. The first main transport mechanisms and the second main transport mechanisms on the same stories are arranged to transfer the substrates with each other. The first main transport mechanism on at least one of the stories is constructed extendible and retractable or vertically movable to and from a plurality of stories, including the one of the stories, within the coating block, to transfer the substrates to and from the second main transport mechanisms. The substrates can be transported between the same stories and between different stories of the coating block and developing block. Since the substrates can be transported flexibly in this way, the substrates can conveniently receive both the treatment to form resist film thereon and the treatment to develop the substrates.

In the embodiment noted above, the second main transport mechanism on at least one of the stories may be constructed extendible and retractable or vertically movable to and from a plurality of stories, including the one of the stories within the one of the treating blocks, to transfer the substrates to and from the first main transport mechanisms. Then, the substrates can be transported with increased flexibility between the coating block and developing block.

In the embodiment noted above, the treating blocks where the substrates are transportable between different stories may be a coating block and a developing block. The coating block has coating units and heat-treating units as the treating units for forming resist film on the substrates and first main transport mechanisms as the main transport mechanisms for transporting the substrates to and from the coating units and the heat-treating units. The developing block has developing units and heat-treating units as the treating units for developing the substrates and second main transport mechanisms as the main transport mechanisms for transporting the substrates to and from the developing units and the heat-treating units. The first main transport mechanisms and the second main transport mechanisms on the same stories are arranged to transfer the substrates with each other; and the second main transport mechanism on at least one of the stories is constructed extendible and retractable or vertically movable to and from a plurality of stories, including the one of the stories within the developing block, to transfer the substrates to and from the first main transport mechanisms. The substrates can be transported between the same stories and between different stories of the coating block and developing block. Since the substrates can be transported flexibly in this way, the substrates can conveniently receive both the treatment to form resist film thereon and the treatment to develop the substrates.

This specification discloses embodiments of an invention directed to the following substrate treating apparatus:

(1) A substrate treating apparatus comprising a plurality of treating blocks juxtaposed horizontally, each including treating units arranged on each of stories divided vertically for treating substrates, and a main transport mechanism provided on each of the stories for transporting the substrates to and from the treating units arranged thereon wherein the substrates are transportable between the same stories of adjoining ones of the treating blocks and, in at least a pair of adjoining ones of the treating blocks, transportable between at least one of the stories of one of the treating blocks and a plurality of stories of the other treating block.

According to the substrate treating apparatus defined in (1) above, the substrates are transported between adjoining treating blocks, thereby allowing a series of treatments to be carried out for the substrates. In at least a pair of adjoining treating blocks, the substrates are transported also between at least one of the stories of one of the treating blocks and a plurality of stories of the other treating block, thereby carrying out a series of treatments for the substrates. Thus, since this apparatus provides transport paths greater in number than the stories, the substrates can be transported flexibly. As a result, even when one of the main transport mechanisms becomes unable to transport the substrates, the substrates can be transported through transport paths including the other main transport mechanism capable of transporting the substrates normally, thereby carrying out the series of treatments for the substrates.

(2) In an embodiment of the substrate treating apparatus, one of the stories of the coating block is arranged to transport the substrates to a story of the developing block different from the one of the stories.

According to the substrate treating apparatus defined in (2) above, the substrates can be transported flexibly from the coating block to the developing block.

(3) In an embodiment of the substrate treating apparatus, one of the stories of the coating block is capable of transporting the substrates to and from all the stories of the developing block.

According to the substrate treating apparatus defined in (3) above, the substrates can be transported flexibly between the coating block and the developing block.

(4) In an embodiment of the substrate treating apparatus, one of the stories of the developing block is capable of transporting the substrates to a different story of the coating block.

According to the substrate treating apparatus defined in (4) above, the substrates can be transported flexibly from the developing block to the coating block.

(5) In an embodiment of the substrate treating apparatus, one of the stories of the developing block is capable of transporting the substrates to and from all the stories of the coating block.

According to the substrate treating apparatus defined in (5) above, the substrates can be transported flexibly between the coating block and the developing block.

BRIEF DESCRIPTION OF THE DRAWINGS

For the purpose of illustrating the invention, there are shown in the drawings several forms, it being understood, however, that the invention is not limited to the precise arrangement and instrumentalities shown.

DETAILED DESCRIPTION OF THE INVENTION

Embodiments of this invention will be described in detail hereinafter with reference to the drawings.

First Embodiment

Figure 1:
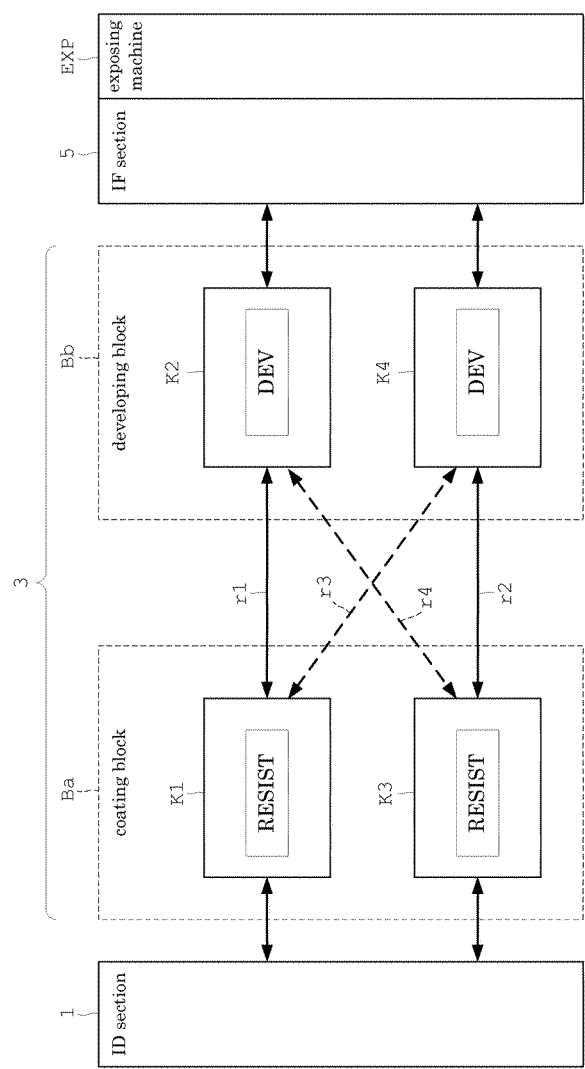
FIG. 1 is a schematic view showing an outline of a substrate treating apparatus according to an embodiment of the present invention.

An outline of this embodiment will be described first. FIG. 1 is a schematic view showing an outline of a substrate treating apparatus in this embodiment.

This embodiment provides a substrate treating apparatus for forming resist film on substrates (e.g. semiconductor wafers) W, and developing exposed wafers W. This apparatus includes an indexer section (hereinafter called "ID section") 1, a treating section 3, and an interface section (hereinafter called "IF section") 5. The ID section 1, treating section 3 and IF section 5 are arranged adjacent one another in the stated order. An exposing machine EXP, which is an external apparatus separate from this apparatus, is disposed adjacent the IF section 5.

The ID section 1 receives wafers W transported to the apparatus from outside, and transports the wafers W to the treating section 3. The treating section 3 carries out treatment for forming film on the wafers W transported from the ID section 1, and treatment for developing the wafers W. The IF section 5 transports the wafers W to and from the exposing machine EXP. The exposing machine EXP exposes the wafers W.

The treating section 3 includes a coating block Ba and a developing block Bb. The coating block Ba and developing block Bb are arranged side by side between the ID section 1 and IF section 5. The coating block Ba is disposed adjacent the ID section 1, while the developing block Bb is disposed adjacent the IF section 5. The coating block Ba forms resist film on the wafers W. The developing block Bb develops the wafers W.

Each of the treating blocks Ba and Bb is vertically divided into a plurality of stories K. In this embodiment, the coating block Ba has an upper story K1 and a lower story K3. Similarly, the developing block Bb has an upper story K2 and a lower story K4. The story K1 and story K2 are at the same level (height position), and the story K3 and story K4 are also at the same level (height position). The story K1 (K2) and story K3 (K4) are at different levels (height positions). In this specification, the stories in the same height position are referred to as the "same stories" or "between the same stories" where appropriate. The stories in the different height positions are referred to as "different stories."

The treating section 3 as a whole has a layered structure with the stories K1 and K2 forming an upper story, and the stories K3 and K4 forming a lower story.

Each story K of the treating blocks Ba and Bb includes treating units for treating wafers W, and a main transport mechanism for transporting the wafers W to and from the treating units on that story. The treating units on each story K1 or K3 of the coating block Ba include coating units for forming resist film on the wafers W. The coating units are, for example, resist film coating units RESIST for applying a resist film material to the wafers W. The treating units on each story K2 or K4 of the developing block Bb include, for example, developing units DEV for developing the wafers W. FIG. 1 shows only the resist film coating units RESIST and developing units DEV. Each of the coating block Ba and developing block Bb corresponds to the treating block in this invention.

The apparatus constructed in this way operates as follows. Wafers W are transported from the ID section 1 to the stories K1 and K3 of the coating block Ba, respectively. On the stories K1 and K3, treatment is carried out to form resist film on the wafers W. Upon completion of this treatment, the wafers W with resist film formed thereon are transported from the story K1 to either the story K2 or story K4. Similarly, the wafers W with resist film formed thereon are transported from the story K3 to either the story K2 or story K4.

Each of the stories K2 and K4 transports the wafers W to the IF section 5. The IF section 5 transports the wafers W to the exposing machine EXP. The exposing machine EXP exposes the wafers W having resist film formed thereon. Upon completion of the exposure, the exposed wafers W are transported from the exposing machine EXP to the IF section 5.

The wafers W are transported from the IF section 5 to the stories K2 and K4 of the developing block Bb. On the stories K2 and K4, treatment is carried out to develop the exposed wafers W. Upon completion of this treatment, the treated wafers W are transported from the story K2 to either the story K1 or story K3. Similarly, the treated wafers W are transported from the story K4 to either the story K1 or story K3. Each of the stories K1 and K3 transports the wafers W to the ID section 1.

In this way, the wafers W can be transported between the same stories of the adjoining treating blocks Ba and Bb (between story K1 and story K2, and between story K3 and story K4). It is also possible to transport the wafers W between the different stories K of the adjoining treating blocks Ba and Bb, such as between story K1 and story K4 or between story K2 and story K3.

Thus, there are four paths for transporting wafers W between the treating blocks Ba and Bb, which are story K1-story K2 (r1 in FIG. 1), story K3-story K4 (r2), story K1-story K4 (r3), and story K3-story K2 (r4). When the transport directions are distinguished, the number of paths is doubled to become eight. Consequently, even when it becomes impossible for a certain story K to treat or transport wafers W, the situation can be dealt with flexibly such as by transporting the wafers W through transport paths not including that story K. In such event, it is possible to operate the story of the other treating block B in the same height position as the abnormal story K, thereby inhibiting a significant reduction in the throughput of the entire apparatus.

Figure 2:
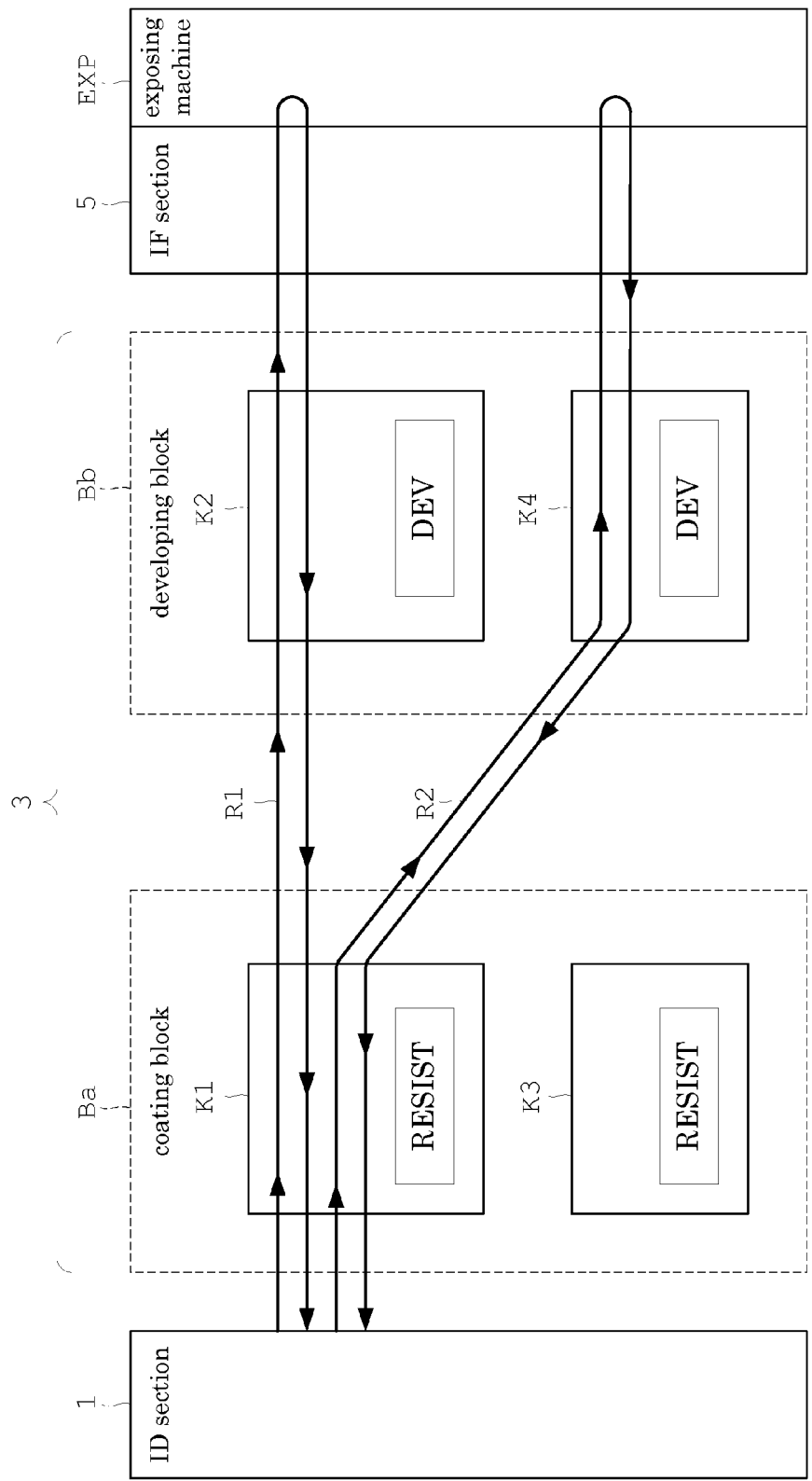
FIG. 2 is a schematic view showing an example of substrate transport paths through the substrate treating apparatus according to an embodiment of the present invention.

This apparatus can transport wafers W through two transport paths R1 and R2 as shown in FIG. 2, for example. The transport path R1 is for transporting wafers W between the same (upper) stories K1 and K2 of the treating blocks Ba and Bb. The transport path R2 is for transporting wafers W between the upper story K1 of the treating block Ba and the lower story K4 of the treating block Bb. The story K3 is included in neither of the transport paths R1 and R2. Transporting wafers W through such transport paths R1 and R2 is effective when treating units (e.g. resist film coating units RESIST) on the story K3 cannot treat wafers W, or when the main transport mechanism on the story K3 cannot transport wafers W (i.e. in an abnormal state). All the wafers W developed in the developing block Bb are transported to the story K1. This renders the quality of treatment among the wafers W more uniform than where the wafers W developed in the developing block Bb are transported to the different story K1 and story K3. The transport paths R1 and R2 allow the wafers W to receive the treatment for forming resist film on the same story K1, and receive the developing treatment on the different stories K2 and K4. This is effective also in that, by carrying out a series of treatments for the wafer W through such transport paths R1 and R2, the stories K2 and K4 can be compared and verified in respect of the quality of treatment and the like.

Figure 3:
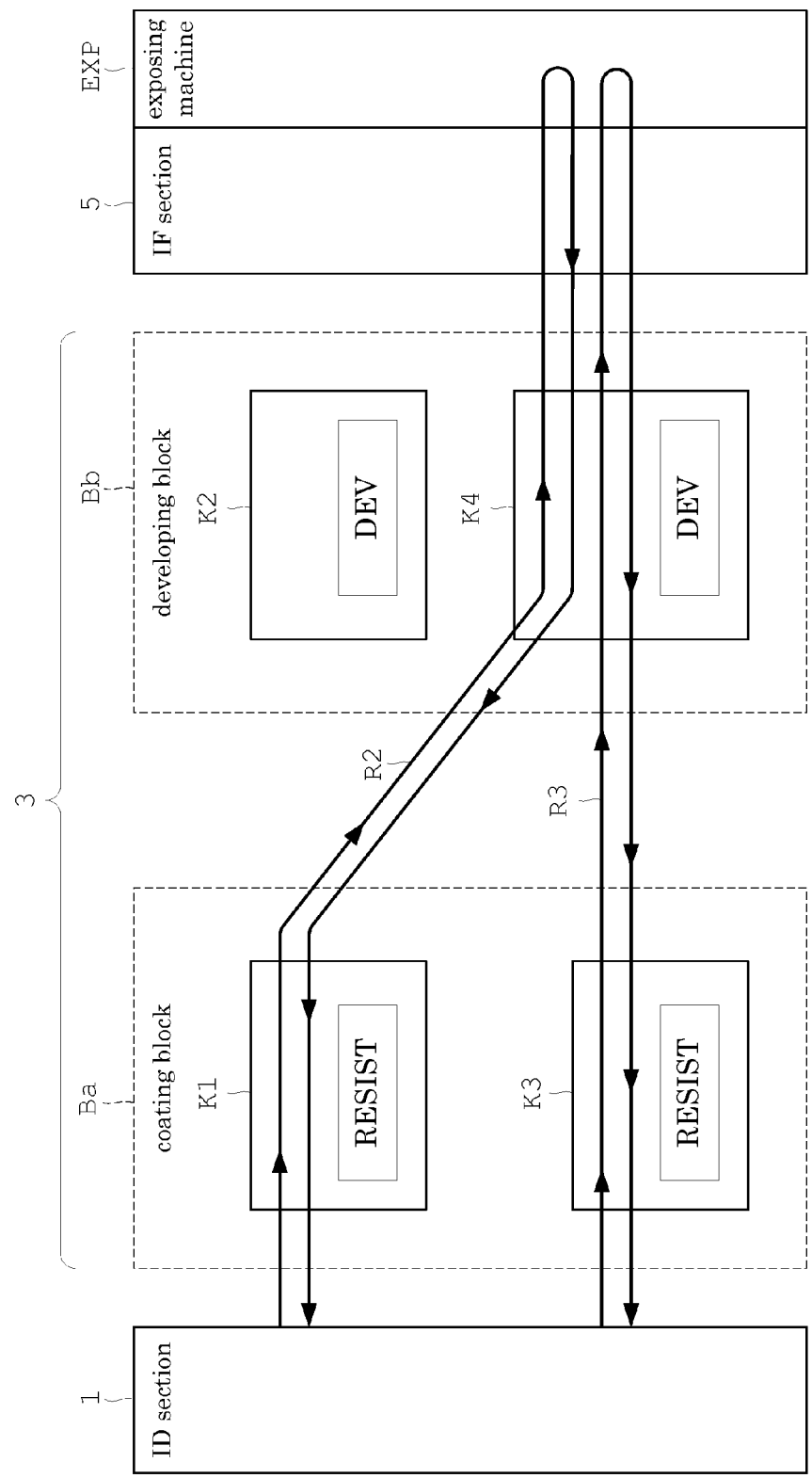
FIG. 3 is a schematic view showing an example of substrate transport paths through the substrate treating apparatus according to an embodiment of the present invention.

This apparatus can transport wafers W through two transport paths R2 and R3 as shown in FIG. 3. The transport path R3 is for transporting wafers W between the same (lower) stories K3 and K4 of the treating blocks Ba and Bb. The story K2 is included in neither of the transport paths R2 and R3. Such transport paths R2 and R3 are effective when treating units (e.g. developing units DEV) on the story K2 cannot treat wafers W, or when the main transport mechanism on the story K2 cannot transport wafers W (i.e. in an abnormal state). The transport paths R2 and R3 allow the wafers W to receive the treatment for forming resist film on the different stories K1 and K3, and receive the developing treatment on the same story K4. This is effective also in that, by carrying out a series of treatments for the wafer W through such transport paths R2 and R3, the stories K1 and K3 can be compared and verified in respect of the quality of treatment and the like.

Figure 4:
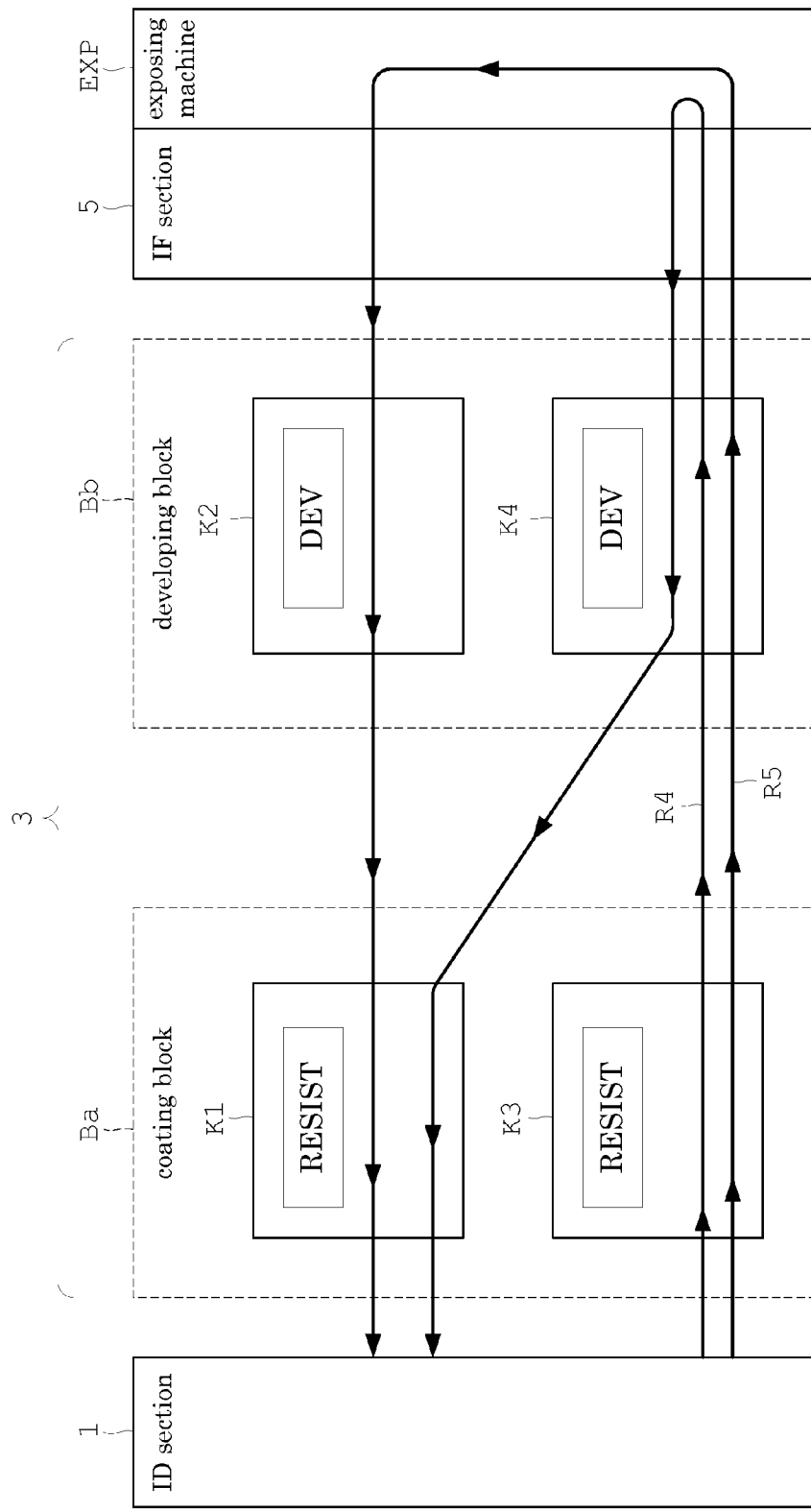
FIG. 4 is a schematic view showing an example of substrate transport paths through the substrate treating apparatus according to an embodiment of the present invention.

Further, this apparatus can transport wafers W through two transport paths R4 and R5 as shown in FIG. 4. The transport path R4 is for transporting wafers W from the story K3 to the story K4, and from the story K4 to the story K1. The transport path R5 is for transporting wafers W from the story K3 to the story K4, and from the story K2 to the story K1. Therefore, as seen, the wafers W are transported in one direction on each of the stories K1 and K3 of the coating block Ba. Specifically, the story K3 of the coating block Ba receives wafers W exclusively from the ID section 1, and feeds the wafers W exclusively to the developing block Bb (story K4). The story K1 of the coating block Ba receives wafers W exclusively from the developing block Bb, and feeds the wafers W exclusively to the ID section 1. Since the coating block Ba carries out treatment before the wafers W are exposed, this treatment is carried out only on the story K3 where the wafers W before exposure are transported exclusively. Such transport paths R4 and R5 are effective when the treating units on the story K1 cannot treat wafers W. That is, the main transport mechanism on the story K1 is operated to transport wafers W from the developing block Bb to the ID section 1, thereby to ease the burden of the main transport mechanism on the story K3, and increase the throughput of the entire apparatus.

In this invention, the paths r for transporting wafers W between the treating blocks Ba and Bb are not limited to the four transport paths r1-r4 noted hereinbefore. That is, the paths may be any three of the transport paths r1-r4. The transport paths r1, r2 and r3 are sufficient for the example of operation illustrated in FIG. 2 through 4. Further, the transport paths r3 and r4 can transport wafers W only in one way, besides being capable of transporting wafers W bidirectionally. In the example of operation illustrated in FIG. 4, for example, the transport path r3 may transport wafers W only in one direction from the developing block Bb to the coating block Ba.

The construction of each component of this embodiment will be described in greater detail hereinafter.

Figure 5:
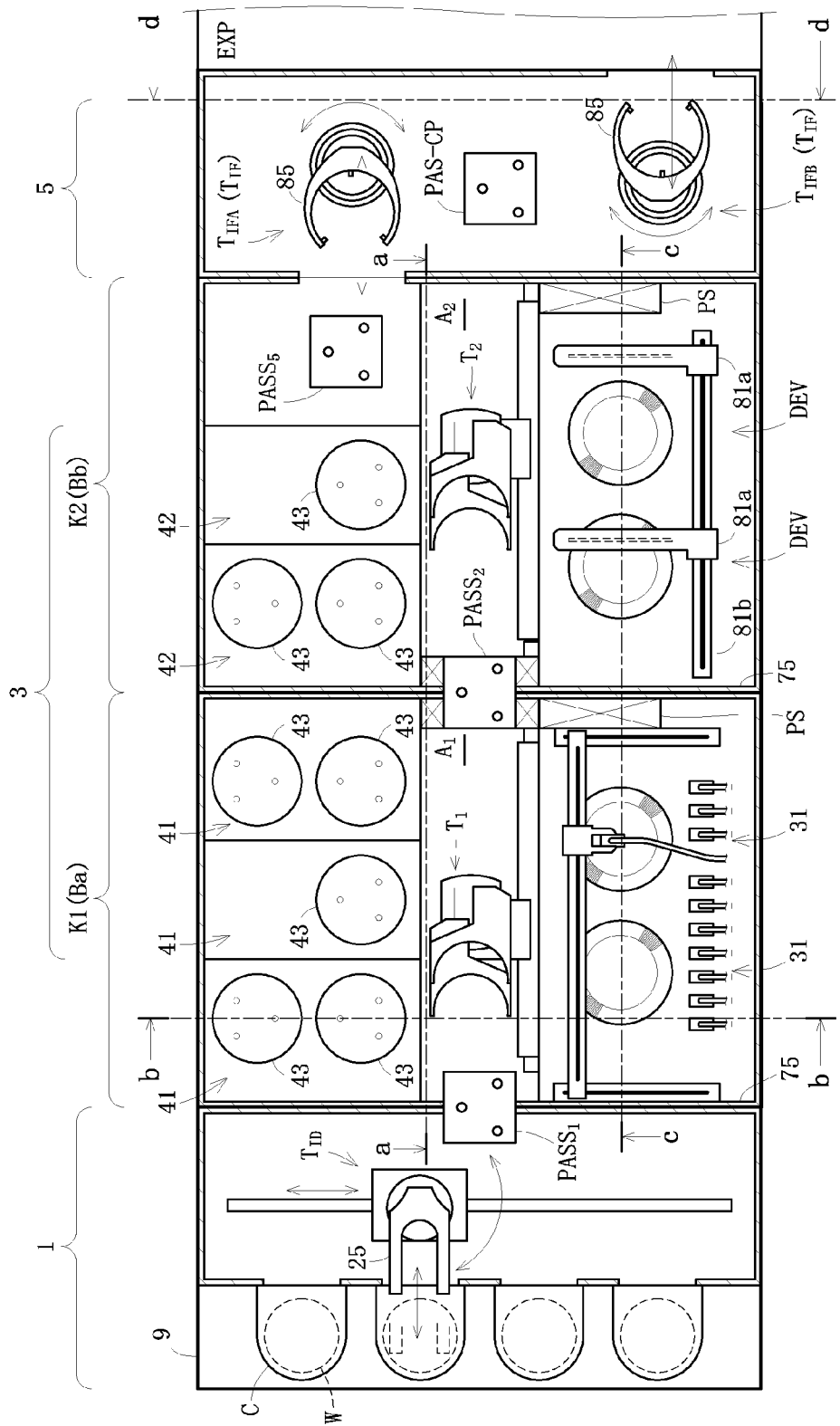
FIG. 5 is a plan view showing an outline of the substrate treating apparatus according to an embodiment of the present invention.
Figure 6:
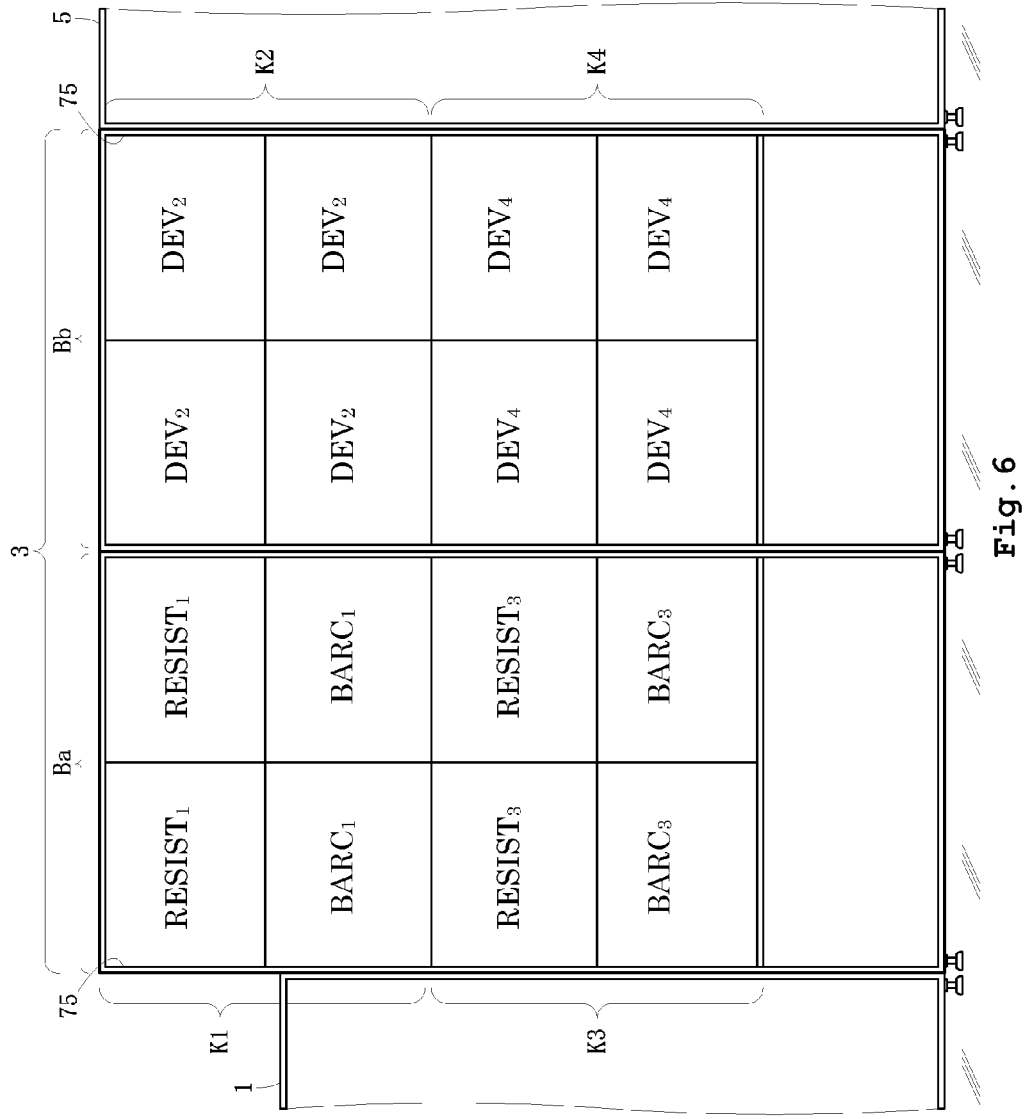
FIG. 6 is a schematic side view showing an arrangement of treating units included in the substrate treating apparatus.
Figure 7:
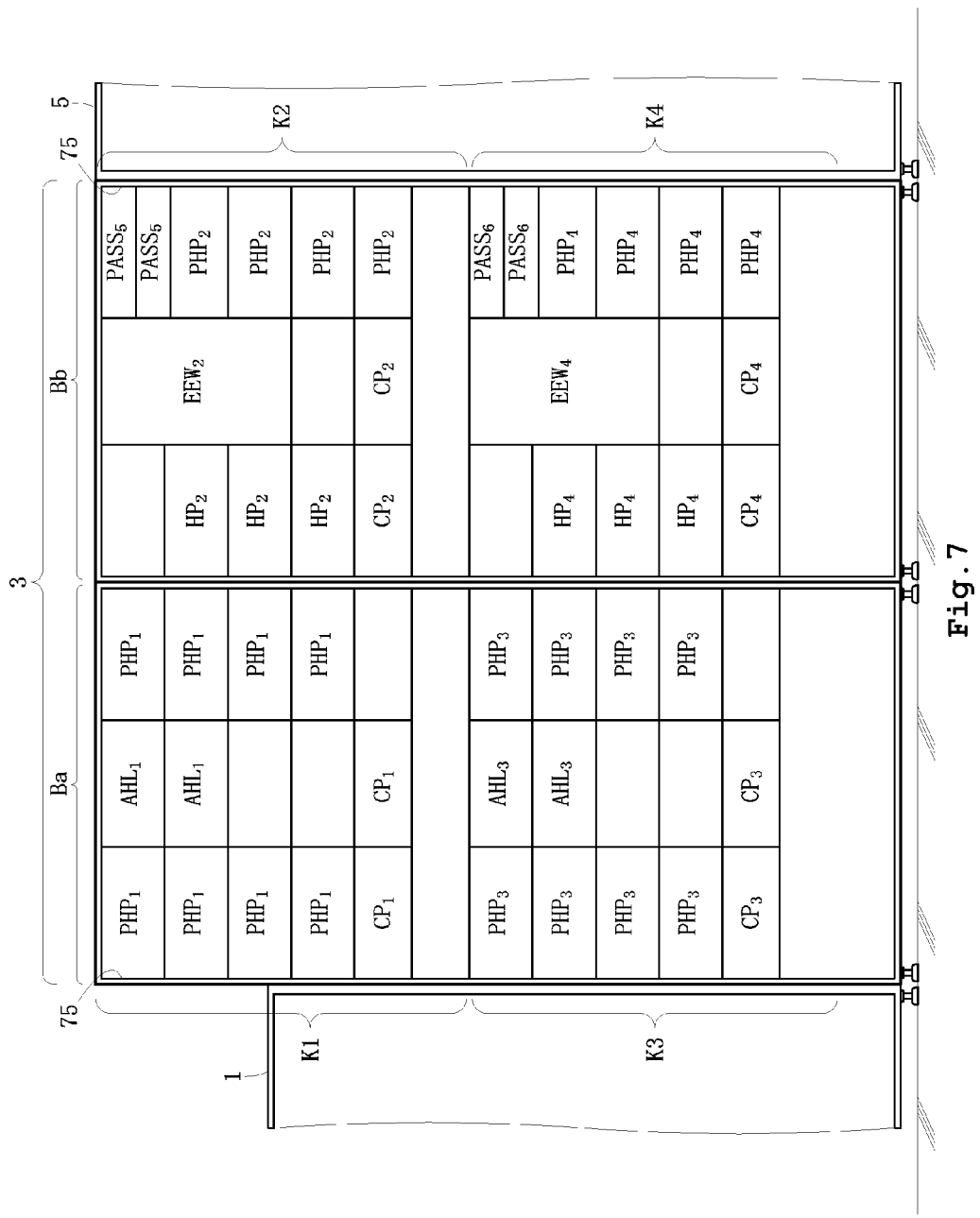
FIG. 7 is a schematic side view showing an arrangement of treating units included in the substrate treating apparatus.

FIG. 5 is a plan view showing an outline of the substrate treating apparatus according to this embodiment. FIGS. 6 and 7 are schematic side views showing an arrangement of the treating units included in the substrate treating apparatus. FIGS. 8 through 11 are views in vertical section taken on lines a-a, b-b, c-c and d-d of FIG. 5, respectively.

ID Section 1

The ID section 1 takes wafers W out of each cassette C, which stores a plurality of wafers W, and deposits wafers W in the cassette C. The ID section 1 has a cassette table 9 for receiving cassettes C. The cassette table 9 can receive four cassettes C as arranged in a row. The ID section 1 has also an ID transport mechanism $T_{ID}$. The ID transport mechanism $T_{ID}$ transports wafers W to and from each cassette C, and transports wafers W to and from receivers $PASS_1$ and $PASS_3$ to be described hereinafter. The ID transport mechanism $T_{ID}$ has a movable base 21 for moving horizontally alongside the cassette table 9 in the direction of arrangement of the cassettes C, a lift shaft 23 vertically extendible and contractible relative to the movable base 21, and a holding arm 25 swivelable on the lift shaft 23, and extendible and retractable radially of the swivel motion, for holding a wafer W. The ID transport mechanism $T_{ID}$ corresponds to the indexer's transport mechanism in this invention.

Treating Section 3

Figure 8:
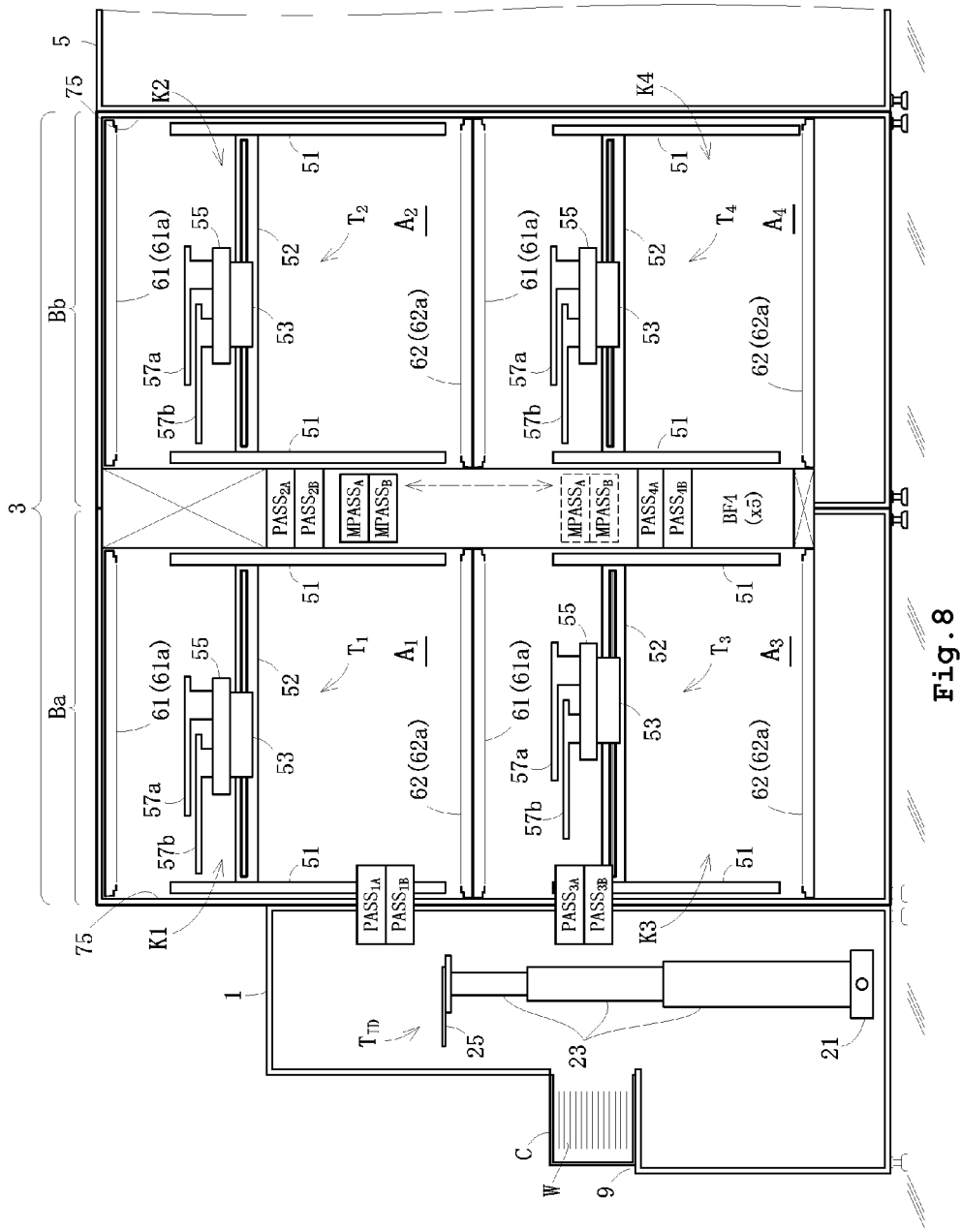
FIG. 8 is a view in vertical section taken on line a-a of FIG. 5.

As shown in FIGS. 5, 8 and others, main transport mechanisms $T_1$ and $T_3$ are arranged on the stories K1 and K3 of the coating block Ba, respectively. Main transport mechanisms $T_2$ and $T_4$ are arranged on the stories K2 and K4 of the developing block Bb, respectively. The treating blocks Ba and Bb will be described separately hereinafter.

Treating Section 3—Coating Block Ba

Receivers $PASS_1$ and $PASS_3$ for receiving wafers W are provided between the ID section 1 and the respective stories K1 and K3 of the treating block Ba. The receiver $PASS_1$ receives, as placed thereon, wafers W passed between the ID transport mechanism $T_{ID}$ and the main transport mechanism $T_1$. Similarly, the receiver $PASS_3$ receives, as placed thereon, wafers W passed between the ID transport mechanism $T_{ID}$ and the main transport mechanism $T_3$. Seen in a sectional view, the receiver $PASS_1$ is disposed at a height adjacent a lower part of the upper story K2, while the receiver $PASS_3$ is disposed at a height adjacent an upper part of the lower story K3. Thus, the positions of receiver $PASS_1$ and receiver $PASS_3$ are relatively close to each other for allowing the ID transport mechanism $T_{ID}$ to move between the receiver $PASS_1$ and receiver $PASS_3$ through using only a small amount of vertical movement.

Receivers $PASS_2$ and $PASS_4$ for receiving wafers W are fixedly provided for the respective stories K between the treating blocks Ba and Bb. Specifically, the receiver $PASS_2$ is disposed between the story K1 and story K2, and the receiver $PASS_4$ between the story K3 and story K4. The main transport mechanisms $T_1$ and $T_2$ transfer wafers W through the receiver $PASS_2$, and the main transport mechanisms $T_3$ and $T_4$ through the receiver $PASS_4$. Thus, the receivers $PASS_2$ and $PASS_4$ are used to transport wafers W between the same stories. The receivers $PASS_2$ and $PASS_4$ correspond to the fixed receivers in this invention.

Further provided between the treating blocks Ba and Bb is a movable receiver MPASS for receiving wafers W, which is vertically movable between the upper and lower stories. Specifically, the movable receiver MPASS is vertically movable by a drive mechanism (not shown) between the receiver $PASS_2$ and receiver $PASS_4$. The movable receiver MPASS is movable between a height position corresponding to the story K1 (K2) and a height position corresponding to the story K3 (K4). The height position corresponding to the story K1 (K2) is slightly lower than the receiver $PASS_2$, which is shown in solid lines in FIG. 8. The height position corresponding to the story K3 (K4) is slightly higher than the receiver $PASS_4$, which is shown in dotted lines in FIG. 8. The main transport mechanism $T_1$ and main transport mechanism $T_2$ can place wafers W on the movable receiver MPASS having moved to the height position corresponding to the story K1 (K2), and can receive wafers W therefrom (that is, wafers W can be transported). Similarly, the main transport mechanism $T_3$ and main transport mechanism $T_4$ can transport wafers W to and from the movable receiver MPASS having moved to the height position corresponding to the story K3 (K4). Although usable to transport wafers W between the same stories, the movable receiver MPASS is used exclusively to transport wafers W between the different stories in this embodiment.

The receiver $PASS_1$ includes a plurality of receivers (two in this embodiment). These receivers $PASS_1$ are arranged vertically adjacent each other. Similarly, each of the receivers $PASS_2$-$PASS_4$, each of receivers $PASS_5$ and $PASS_6$ to be described hereinafter, and the movable receiver MPASS, includes a plurality of receivers (two in this embodiment) arranged vertically adjacent each other. One of the pair of receivers PASS is selected according to a direction for transferring wafers W.

The receiver $PASS_1$, for example, has two receivers $PASS_{1A}$ and $PASS_{1B}$ arranged vertically adjacent each other. One of these receivers $PASS_{1A}$ receives wafers W passed from the ID transport mechanism $T_{ID}$ to the main transport mechanism $T_1$. The other receiver $PASS_{1B}$ receives wafers W passed from the main transport mechanism $T_1$ to the ID transport mechanism $T_{ID}$.

The receiver $PASS_2$, for example, has two receivers $PASS_{2A}$ and $PASS_{2B}$. The main transport mechanism $T_1$ places wafers W on one of these receivers $PASS_{2A}$, and the main transport mechanism $T_2$ receives these wafers W. The main transport mechanism $T_2$ places wafers W on the other receiver $PASS_{2B}$, and the main transport mechanism $T_1$ receives these wafers W.

The movable receiver MPASS, for example, has movable receivers $MPASS_A$ and $MPASS_B$. The main transport mechanism $T_1$ or main transport mechanism $T_3$ places wafers W on one of these movable receivers $MPASS_A$, and the main transport mechanism $T_2$ or main transport mechanism $T_4$ receives these wafers W. The main transport mechanism $T_2$ or main transport mechanism $T_4$ places wafers W on the other movable receiver $MPASS_B$, and the main transport mechanism $T_1$ or main transport mechanism $T_3$ receives these wafers W.

Each of the receivers $PASS_1$-$PASS_E$ and movable receiver MPASS has a plurality of support pins projecting therefrom, for receiving a wafer W in a substantially horizontal position on these support pins. Each of the receivers $PASS_1$-$PASS_E$ and movable receiver MPASS has also a sensor (not shown) for detecting presence or absence of a wafer W. Detection signals of each sensor are inputted to a control section 90 described hereinafter. Based on the detection signals of each sensor, the control section 90 determines whether or not a wafer W is placed on the receiver PASS or MPASS, and controls the main transport mechanisms T in transferring wafers W through the receiver PASS or MPASS.

The story K1 will now be described. The treating units on the story K1 are coating units 31 and heat-treating units 41 for forming resist film on wafers W. The main transport mechanism $T_1$ transports the wafers W to and from the coating units 31 and heat-treating units 41. The main transport mechanism $T_1$ is movable in a transporting space A1 extending substantially through the center of the story K1 and parallel to the direction of transport. The coating units 31 are arranged on one side of the transporting space $A_1$, while the heat-treating units 41 are arranged on the other side thereof.

The coating units 31 are arranged vertically and horizontally, each facing the transporting space $A_1$. In this embodiment, four coating units 31 in total are arranged in two columns and two rows.

The coating units 31 include anti-reflection film coating units BARC for forming anti-reflection film on the wafers W, and resist film coating units RESIST for forming resist film on the wafers W (i.e. carrying out resist film forming treatment).

The anti-reflection film coating units BARC apply a treating solution for anti-reflection film to the wafers W. The resist film coating units RESIST apply a resist film material to the wafers W. The plurality of (two) anti-reflection film coating units BARC are arranged at substantially the same height in the lower row. The plurality of (two) resist film coating units RESIST are arranged at substantially the same height in the upper row. No dividing wall or partition is provided between the anti-reflection film coating units BARC. That is, all the anti-reflection film coating units BARC are only housed in a common chamber, and the atmosphere around each anti-reflection film coating unit BARC is not blocked off (i.e. is in communication). Similarly, the atmosphere around each resist film coating unit RESIST is not blocked off.

Figure 12A:
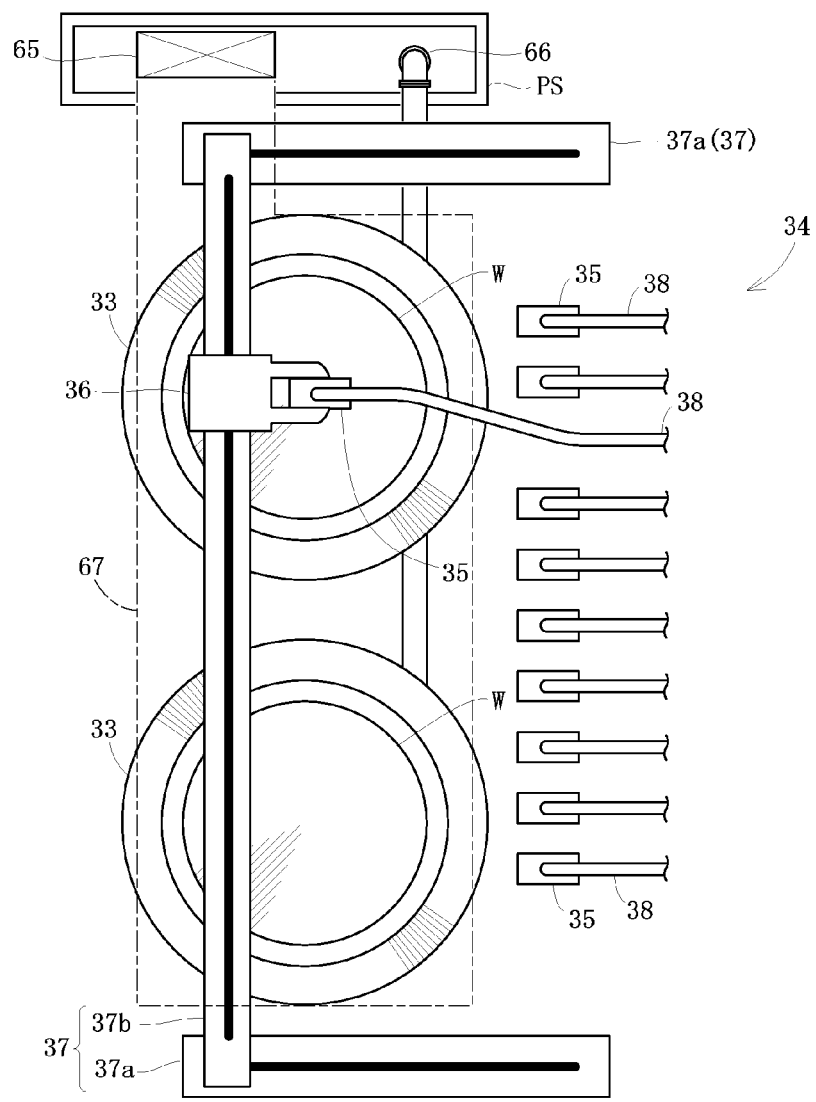
FIG. 12A is a plan view of coating units.
Figure 12B:
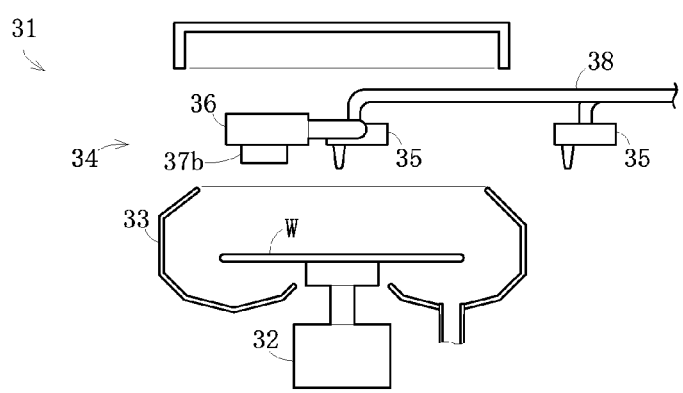
FIG. 12B is a sectional view of a coating unit.

Reference is made to FIGS. 12A and 12B. FIG. 12A is a plan view of the coating units 31. FIG. 12B is a sectional view of a coating unit 31. Each coating unit 31 includes a spin holder 32 for holding and spinning a wafer W, a cup 33 surrounding the wafer W, and a supply device 34 for supplying a treating solution to the wafer W.

The supply device 34 includes a plurality of nozzles 35, a gripper 36 for gripping one of the nozzles 35, and a nozzle moving mechanism 37 for moving the gripper 36 to move one of the nozzles 35 between a treating position above the wafer W and a standby position away from above the wafer W. Each nozzle 35 has one end of a treating solution pipe 38 connected thereto. The treating solution pipe 38 is arranged movable (flexible) to permit movement of the nozzle 35 between the standby position and treating position. The other end of each treating solution pipe 38 is connected to a treating solution source (not shown). Specifically, in the case of anti-reflection film coating units BARC, the treating solution sources supply different types of treating solution for anti-reflection film to the respective nozzles 35. In the case of resist film coating units RESIST, the treating solution sources supply different types of resist film material to the respective nozzles 35.

The nozzle moving mechanism 37 has first guide rails 37a and a second guide rail 37b. The first guide rails 37a are arranged parallel to each other and opposed to each other across the two cups 33 arranged sideways. The second guide rail 37b is slidably supported by the two first guide rails 37a and disposed above the two cups 33. The gripper 36 is slidably supported by the second guide rail 37b. The first guide rails 37a and second guide rail 37b take guiding action substantially horizontally and in directions substantially perpendicular to each other. The nozzle moving mechanism 37 further includes drive members (not shown) for sliding the second guide rail 37b, and sliding the gripper 36. The drive members are operable to move the nozzle 35 gripped by the gripper 36 to the treating positions above the two spin holders 32.

The plurality of heat-treating units 41 are arranged vertically and horizontally, each facing the transporting space $A_1$. In this embodiment, three heat-treating units 41 can be arranged horizontally, and five heat-treating units 41 can be stacked vertically. Each heat-treating unit 41 has a plate 43 for receiving a wafer W. The heat-treating units 41 include cooling units CP for cooling wafers W, heating and cooling units PHP for carrying out heating and cooling treatments continually, and adhesion units AHL for heat-treating wafers W in an atmosphere of hexamethyldisilazane (HMDS) vapor in order to promote adhesion of coating film to the wafers W. As shown in FIG. 5, each heating and cooling unit PHP has two plates 43, and a local transport mechanism (not shown) for moving a wafer W between the two plates 43. The various types of heat-treating units CP, PHP and AHL are arranged in appropriate positions.

Figure 13:
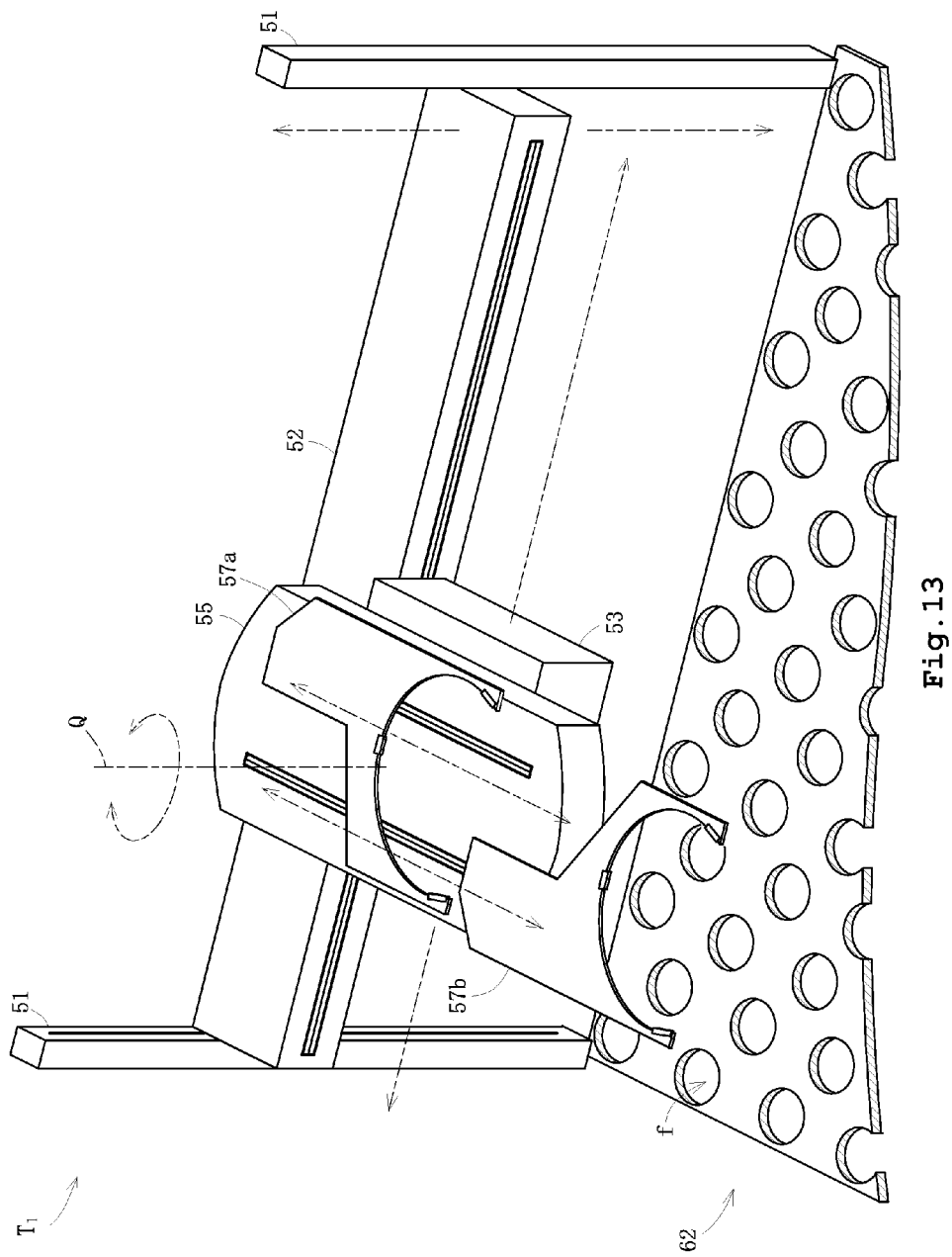
FIG. 13 is a perspective view of a main transport mechanism.

The main transport mechanism $T_1$ will be described specifically. Reference is made to FIG. 13. FIG. 13 is a perspective view of the main transport mechanism $T_1$. The main transport mechanism $T_1$ has two third guide rails 51 for providing vertical guidance, and a fourth guide rail 52 for providing horizontal guidance. The third guide rails 51 are fixed opposite each other at one side of the transporting space $A_1$. In this embodiment, the third guide rails 51 are arranged at the side adjacent to the coating units 31. The fourth guide rail 52 is slidably attached to the third guide rails 51. The fourth guide rail 52 has a base 53 slidably attached thereto. The base 53 extends transversely, substantially to the center of the transporting space $A_1$. Further, drive members (not shown) are provided for vertically moving the fourth guide rail 52, and horizontally moving the base 53. The drive members are operable to move the base 53 to positions for accessing the coating units 31 and heat-treating units 41 arranged vertically and horizontally.

The base 53 has a turntable 55 rotatable about a vertical axis Q. The turntable 55 has two holding arms 57a and 57b horizontally movably attached thereto for holding wafers W, respectively. The two holding arms 57a and 57b are arranged vertically close to each other. Further, drive members (not shown) are provided for rotating the turntable 55, and extending and retracting the holding arms 57a and 57b. The drive members are operable to move the turntable 55 to positions opposed to the coating units 31, heat-treating units 41, receivers $PASS_1$ and $PASS_2$, and movable receiver MPASS, having moved to the height position corresponding to the story K1 (K2), and to extend and retract the holding arms 57a and 57b to and from the coating units 31 and so on.

The story K3 will be described next. Like reference numerals are used to identify like parts which are the same as in the story K1, and will not be described again. The layout (arrangement) in plan view of the main transport mechanism $T_3$ and various treating units on the story K3 is substantially the same as on the story K1. Thus, the arrangement of the various treating units of the story K3 as seen from the main transport mechanism $T_3$ is substantially the same as the arrangement of the various treating units of the story K1 as seen from the main transport mechanism $T_1$. The coating units 31 and heat-treating units 41 of the story K3 are stacked under the coating units 31 and heat-treating units 41 of the story K1, respectively.

In the following description, when distinguishing the resist film coating units RESIST in the stories K1 and K3, subscripts "1" and "3" will be affixed (for example, the resist film coating units RESIST in the story K1 will be referred to as "resist film coating units $RESIST_1$.").

Figure 9:
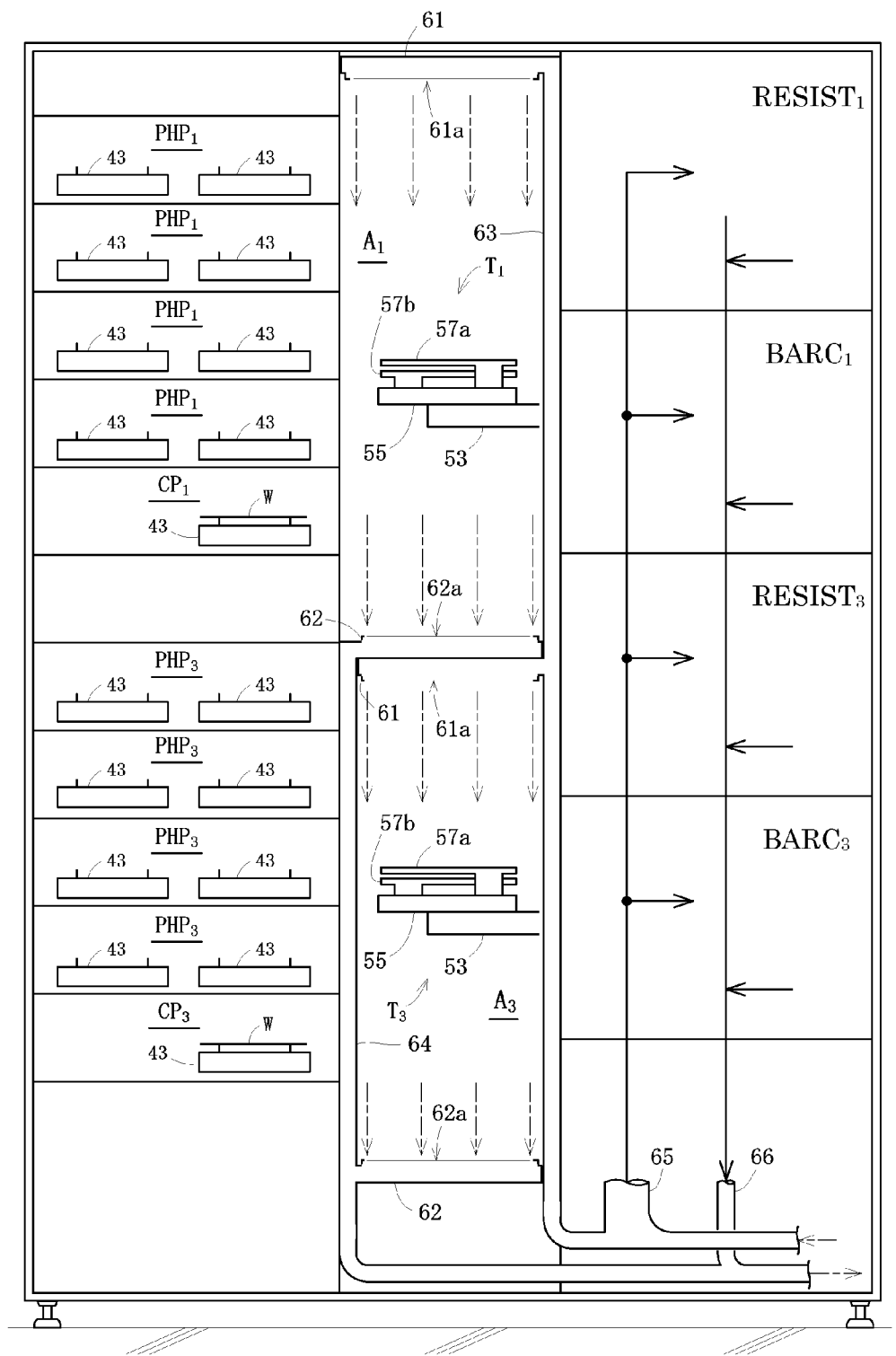
FIG. 9 is a view in vertical section taken on line b-b of FIG. 5.

The other aspects of the treating block Ba will be described. As shown in FIGS. 8 and 9, each of the transporting spaces $A_1$ and $A_3$ has a first blowout unit 61 for blowing out a clean gas, and an exhaust unit 62 for sucking in the gas. Each of the first blowout unit 61 and exhaust unit 62 is in the form of a flat box having substantially the same area as the transporting space $A_1$ in plan view. Each of the first blowout unit 61 and exhaust unit 62 has first blowout openings 61a or exhaust openings 62a formed in one surface thereof. In this embodiment, the first blowout openings 61a or exhaust openings 62a are in the form of numerous small bores f (see FIG. 13). The first blowout units 61 are arranged over the transporting spaces $A_1$ and $A_3$ with the first blowout openings 61a directed downward. The exhaust units 62 are arranged under the transporting spaces $A_1$ and $A_3$ with the exhaust openings 62a directed upward. The atmosphere in the transporting space $A_1$ and the atmosphere in the transporting space $A_3$ are blocked off by the exhaust unit 62 of the transporting space $A_1$ and the first blowout unit 61 of the transporting space $A_3$. Thus, each of the stories K1 and K3 has the atmosphere blocked off from the other.

Referring to FIG. 9, the first blowout units 61 of the transporting spaces $A_1$ and $A_3$ are connected to a common, first gas supply pipe 63. The first gas supply pipe 63 extends laterally of the receivers $PASS_2$ and $PASS_4$ from an upper position of the transporting space $A_1$ to a lower position of the transporting space $A_3$, and is bent below the transporting space $A_3$ to extend horizontally. The other end of the first gas supply pipe 63 is connected to a gas source not shown. Similarly, the exhaust units 62 of the transporting spaces $A_1$ and $A_3$ are connected to a common, first gas exhaust pipe 64. The first gas exhaust pipe 64 extends laterally of the receivers $PASS_2$ and $PASS_4$ from a lower position of the transporting space $A_1$ to a lower position of the transporting space $A_3$, and is bent below the transporting space $A_3$ to extend horizontally. As the gas is blown out of each first blowout opening 61a and sucked and exhausted through each exhaust opening 62a of the transporting spaces $A_1$ and $A_3$, gas currents are formed to flow from top to bottom of the transporting spaces $A_1$ and $A_3$, thereby keeping each of the transporting spaces $A_1$ and $A_3$ in a clean state.

Figure 10:
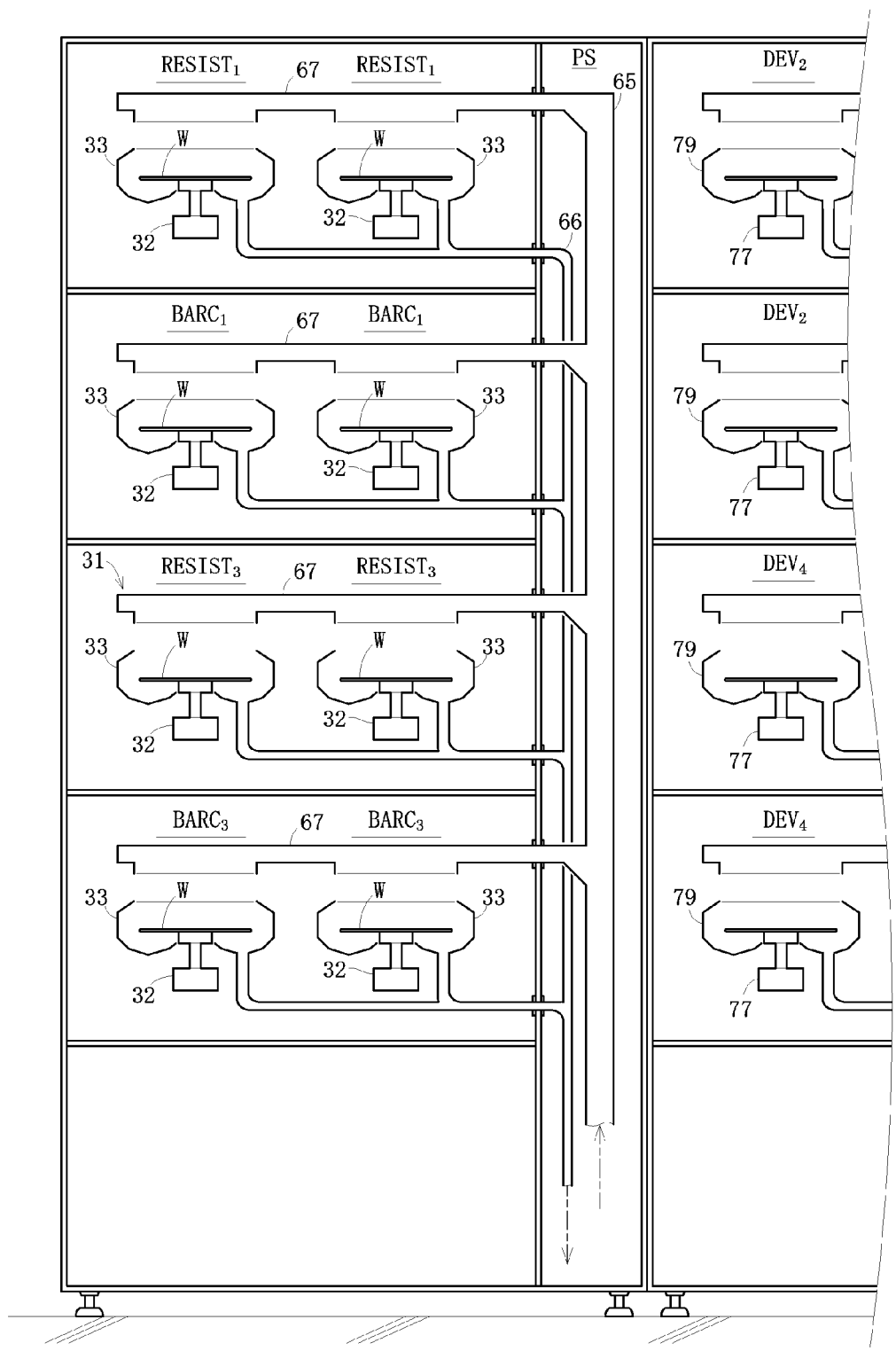
FIG. 10 is a view in vertical section taken on line c-c of FIG. 5.

As shown in FIGS. 5, 10 and 12A, each coating unit 31 of the stories K1 and K3 has a pit portion PS extending vertically. The pit portion PS accommodates a second gas supply pipe 65 extending vertically for supplying the clean gas, and a second gas exhaust pipe 66 extending vertically for exhausting the gas. Each of the second gas supply pipe 65 and second gas exhaust pipe 66 branches at a predetermined height in each coating unit 31 to extend substantially horizontally from the pit portion PS. A plurality of branches of the second gas supply pipe 65 are connected to second blowout units 67 for blowing out the gas downward. A plurality of branches of the second gas exhaust pipe 66 are connected for communication to the bottoms of the respective cups 33. The other end of the second gas supply pipe 65 is connected to the first gas supply pipe 63 below the story K3. The other end of the second gas exhaust pipe 66 is connected to the first gas exhaust pipe 64 below the story K3. As the gas is blown out of the second blowout units 67 and exhausted through the second exhaust pipes 62a, the atmosphere inside each cup 33 is constantly maintained clean, thereby allowing for excellent treatment of the wafer W held by the spin holder 32.

The pit portions PS further accommodate piping of the treating solutions, electric wiring and the like (not shown).

Thus, with the pit portions PS accommodating the piping and electric wiring provided for the coating units 31 of the stories K1 and K3, the piping and electric wiring can be reduced in length.

The treating block Ba has one housing 75 for accommodating the main transport mechanisms $T_1$ and $T_3$, coating units 31 and heat-treating units 41 described hereinbefore. The treating block Bb described hereinafter also has a housing 75 for accommodating the main transport mechanisms $T_2$ and $T_4$ and the various treating units of the treating block Bb. The housing 75 of the treating block Ba and the housing 75 of the treating block Bb are separate entities. Thus, with each of the treating blocks Ba and Bb having the housing 75 accommodating the main transport mechanisms T and various treating units en bloc, the treating section 3 may be manufactured and assembled simply. The main transport mechanisms $T_1$ and $T_3$ correspond to the first main transport mechanisms in this invention.

Treating Section 3—Developing Block Bb

The story K2 will be described. Like reference numerals are used to identify like parts which are the same as in the story K1 and will not be described again. The story K2 has a transporting space A2 formed as an extension of the transporting space $A_1$.

The treating units on the story K2 are developing units DEV for developing wafers W, heat-treating units 42 for heat-treating the wafers W, and an edge exposing unit EEW for exposing peripheral regions of the wafers W. The developing units DEV are arranged at one side of the transporting space $A_2$, and the heat-treating units 42 and edge exposing unit EEW are arranged at the other side of the transporting space $A_2$. Preferably, the developing units DEV are arranged at the same side as the coating units 31. It is also preferable that the heat-treating units 42 and edge exposing unit EEW are arranged in the same row as the heat-treating units 41.

The number of developing units DEV is four, and sets of two units DEV arranged horizontally along the transporting space $A_2$ are stacked one over the other. As shown in FIGS. 5 and 10, each developing unit DEV includes a spin holder 77 for holding and spinning a wafer W, and a cup 79 surrounding the wafer W. The two developing units DEV arranged at the lower level are not separated from each other by a partition wall or the like. A supply device 81 is provided for supplying developers to the two developing units DEV. The supply device 81 includes two slit nozzles 81*a* having a slit or a row of small bores for delivering the developers. The slit or row of small bores, preferably, has a length corresponding to the diameter of wafer W. Preferably, the two slit nozzles 81*a* are arranged to deliver developers of different types or concentrations. The supply device 81 further includes a moving mechanism 81*b* for moving each slit nozzle 81*a*. Thus, the slit nozzles 81*a* are movable, respectively, over the two spin holders 77 juxtaposed sideways.

The plurality of heat-treating units 42 are arranged sideways along the transporting space $A_2$, and stacked one over the other. The heat-treating units 42 include heating units HP for heating wafers W, cooling units CP for cooling wafers W, and heating and cooling units PHP for successively carrying out heating treatment and cooling treatment.

The plurality of heating and cooling units PHP are vertically stacked in the column closest to the IF section 5, each having one side facing the IF section 5. The heating and cooling units PHP on the story K2 have transport ports formed in the sides thereof for passage of wafers W. IF transport mechanisms $T_{IF}$ to be described hereinafter transport wafers W through the above transport ports to the heating and cooling units PHP. The heating and cooling units PHP arranged on the story K2 carry out post-exposure baking (PEB) treatment for exposed wafers W. Similarly, the heating and cooling units PHP arranged on the story K4 carry out post-exposure baking (PEB) treatment for exposed wafers W.

The single edge exposing unit EEW is disposed in a predetermined position. The edge exposing unit EEW includes a spin holder (not shown) for holding and spinning a wafer W, and a light emitter (not shown) for exposing edges of the wafer W held by the spin holder.

The receiver $PASS_5$ is formed on top of the heating and cooling units PHP on the story K2. Through the receiver $PASS_5$, the main transport mechanism $T_2$ and IF transport mechanisms $T_{IF}$ to be described hereinafter transfer wafers W.

The main transport mechanism $T_2$ is disposed substantially centrally of the transporting space $A_2$ in plan view. The main transport mechanism $T_2$ has the same construction as the main transport mechanism $T_1$. The main transport mechanism $T_2$ transports wafers W to and from the receiver $PASS_2$, movable receiver MPASS having moved to the height position corresponding to the story K1 (K2), developing units DEV, various heat-treating units 42, edge exposing unit EEW and receiver $PASS_5$.

The story K4 will be described briefly. The relationship in construction between story K2 and story K4 is similar to that between stories K1 and K3. The treating units U on the story K4 are developing units DEV, heat-treating units 42 and an edge exposing unit EEW. The heat-treating units 42 on the story K4 include heating units HP, cooling units CP and heating and cooling units PHP. The receiver $PASS_6$ is formed on top of the heating and cooling units PHP on the story K4. The main transport mechanism $T_4$ and IF transport mechanisms $T_{IF}$ described hereinafter transfer wafers W through the receiver $PASS_6$. The heating and cooling units PHP on the story K4 also correspond to the PEB units in this invention.

In the following description, when distinguishing the developing units DEV, edge exposing units EEW and so on provided on the stories K2 and K4, subscripts "2" and "4" will be affixed (for example, the heating units HP on the story K2 will be referred to as "heating units $HP_2$").

Each of the transporting spaces $A_2$ and $A_4$ of the stories K2 and K4 also has constructions corresponding to the first blowout unit 61 and exhaust unit 62. Each developing unit DEV of the stories K2 and K4 also has constructions corresponding to the second blowout unit 67 and second gas exhaust pipe 66.

Each of the main transport mechanism $T_2$ and main transport mechanism $T_4$ corresponds to the second main transport mechanism in this invention.

IF Section 5

The IF section 5 transfers wafers W between the treating section 3 (more particularly, the stories K2 and K4 of the developing block Bb) and the exposing machine EXP. The IF section 5 has IF transport mechanisms $T_{IF}$ for transporting wafers W. IF transport mechanisms $T_{IF}$ include an IF first transport mechanism $T_{IFA}$ and an IF second transport mechanism $T_{IFB}$ that can transfer wafers W to and from each other. IF first transport mechanism $T_{IFA}$ transports wafers W mainly to and from the developing block Bb. IF second transport mechanism $T_{IFB}$ transports wafers W mainly to and from the exposing machine EXP.

As shown in FIG. 5, IF first transport mechanism $T_{IFA}$ and IF second transport mechanism $T_{IFB}$ are arranged in a transverse direction substantially perpendicular to the direction of arrangement of the main transport mechanisms T on each story. IF first transport mechanism $T_{IFA}$ is disposed at the side where the heat-treating units 42 and so on of the treating block Bb are located. IF second transport mechanism $T_{IFB}$ is disposed at the side where the developing units DEV of the treating block Bb are located.

Figure 11:
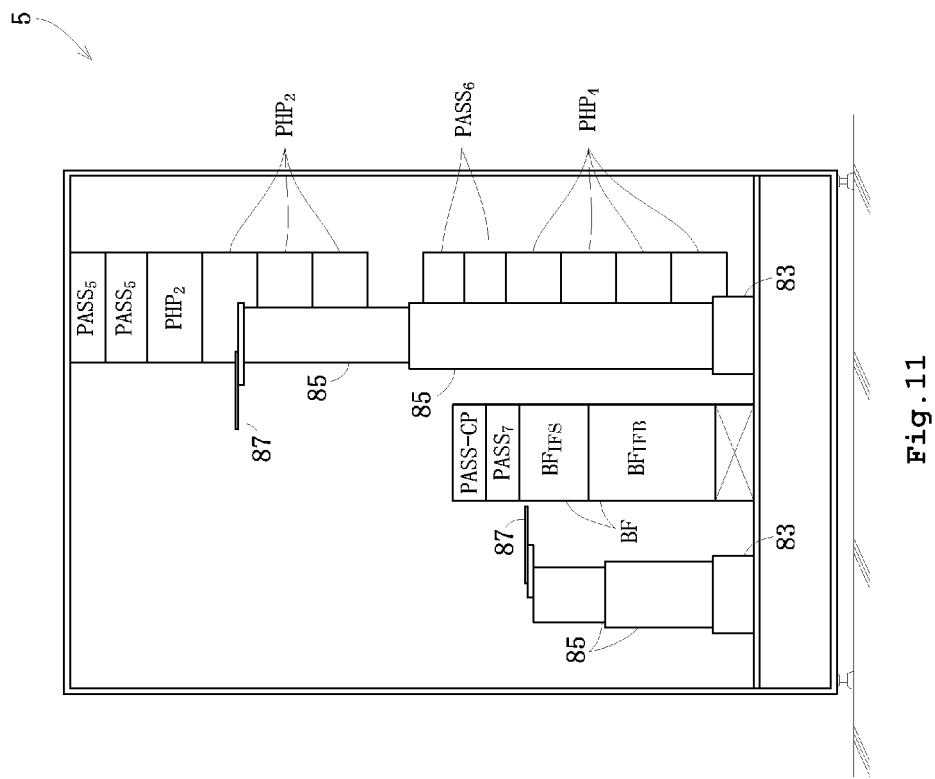
FIG. 11 is a view in vertical section taken on line d-d of FIG. 5.

As shown in FIG. 11, IF first transport mechanism $T_{IFA}$ includes a fixed base 83, lift shafts 85 vertically extendible and contractible relative to the base 83, and a holding arm 87 swivelable on the lift shafts 85, and extendible and retractable radially of the swivel motion, for holding a wafer W. IF second transport mechanism $T_{IFB}$ also has a base 83, lift shafts 85 and a holding arm 87.

Stacked in multiples stages between IF first and second transport mechanisms $T_{IFA}$ and $T_{IFB}$ are a receiver PASS-CP for receiving and cooling wafers W, a receiver $PASS_7$ for receiving wafers W, and buffers $BF_{IF}$ for temporarily storing wafers W. The buffers $BF_{IF}$ are divided into a send buffer $BF_{IFS}$ for temporarily storing wafers W to be sent to the exposing machine EXP, and a return buffer $BF_{IFR}$ for temporarily storing wafers W to be returned to the treating section 3. The return buffer $BF_{IFR}$ stores exposed wafers W having received post-exposure baking (PEB) treatment.

IF first transport mechanism $T_{IFA}$ transports wafers W to and from the receivers $PASS_5$ and $PASS_E$, heating and cooling units PHP on the stories K2 and K4, receiver PASS-CP, receiver $PASS_7$ and buffer $BF_{IF}$. IF second transport mechanism $T_{IFB}$ transports wafers W to and from the exposing machine EXP, receiver PASS-CP and receiver $PASS_7$. IF first and second transport mechanisms $T_{IFA}$ and $T_{IFB}$ transfer wafers W therebetween through the receiver PASS-CP and receiver $PASS_7$. IF transport mechanisms $T_{IF}$ correspond to the interface's transport mechanisms in this invention.

Figure 14:
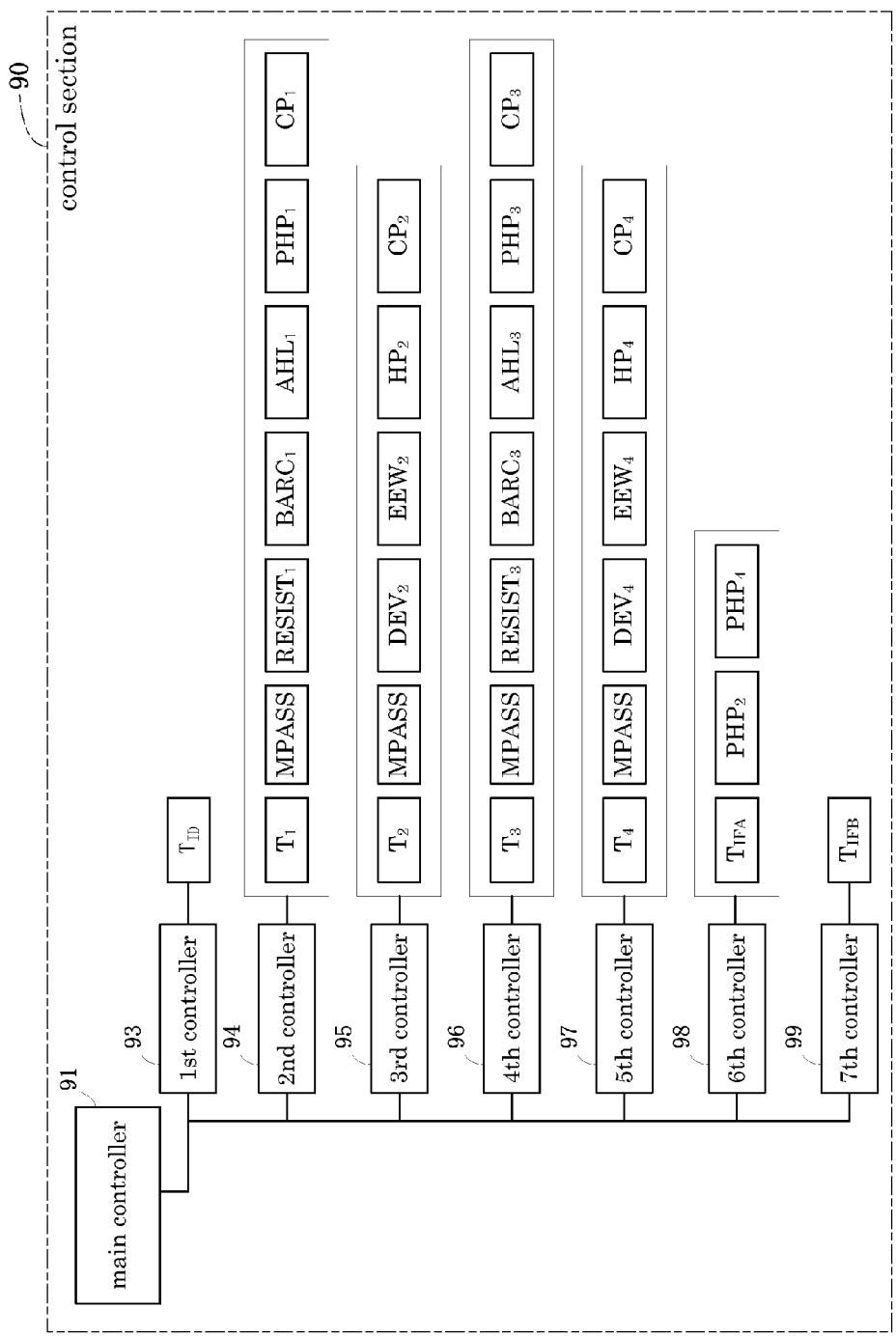
FIG. 14 is a control block diagram of the substrate treating apparatus according to an embodiment of the present invention.

A control system of this apparatus will be described next. FIG. 14 is a control block diagram of the substrate treating apparatus according to the invention. As shown, the control section 90 of this apparatus includes a main controller 91 and first to seventh controllers 93, 94, 95, 96, 97, 98 and 99.

The main controller 91 performs overall control of the first to seventh controllers 93-99. Further, the main controller 91 can communicate through a host computer with an exposing machine controller provided for the exposing machine EXP. The first controller 93 controls substrate transport by the ID transport mechanism $T_{ID}$. The second controller 94 controls substrate transport by the main transport mechanism $T_1$, and substrate treatment in the resist film coating units $RESIST_1$, anti-reflection film coating units $BARC_1$, cooling units $CP_1$, heating and cooling units $PHP_1$ and adhesion units $AHL_1$. The third controller 95 controls substrate transport by the main transport mechanism $T_2$, and substrate treatment in the edge exposing unit $EEW_2$, developing units $DEV_2$, heating units $HP_2$ and cooling units $CP_2$. The controls by the fourth and fifth controllers 96 and 97 correspond to those by the second and third controllers 94 and 95, respectively. The sixth controller 98 controls substrate transport by IF first transport mechanism $T_{IFA}$, and substrate treatment in the heating and cooling units $PHP_2$ and $PHP_4$. The seventh controller 99 controls substrate transport by IF second transport mechanism $T_{IFB}$. Further, each of the second to fifth controllers 94-97 controls vertical movement of the movable receiver MPASS. The first to seventh controllers 93-99 carry out the controls independently of one another.

Each of the main controller 91 and the first to seventh controllers 93-99 is realized by a central processing unit (CPU) which performs various processes, a RAM (Random Access Memory) used as the workspace for operation processes, and a storage medium such as a fixed disk for storing a variety of information including a predetermined processing recipe (processing program). The processing recipe includes also information on the transport paths for transporting wafers W.

Figure 15:
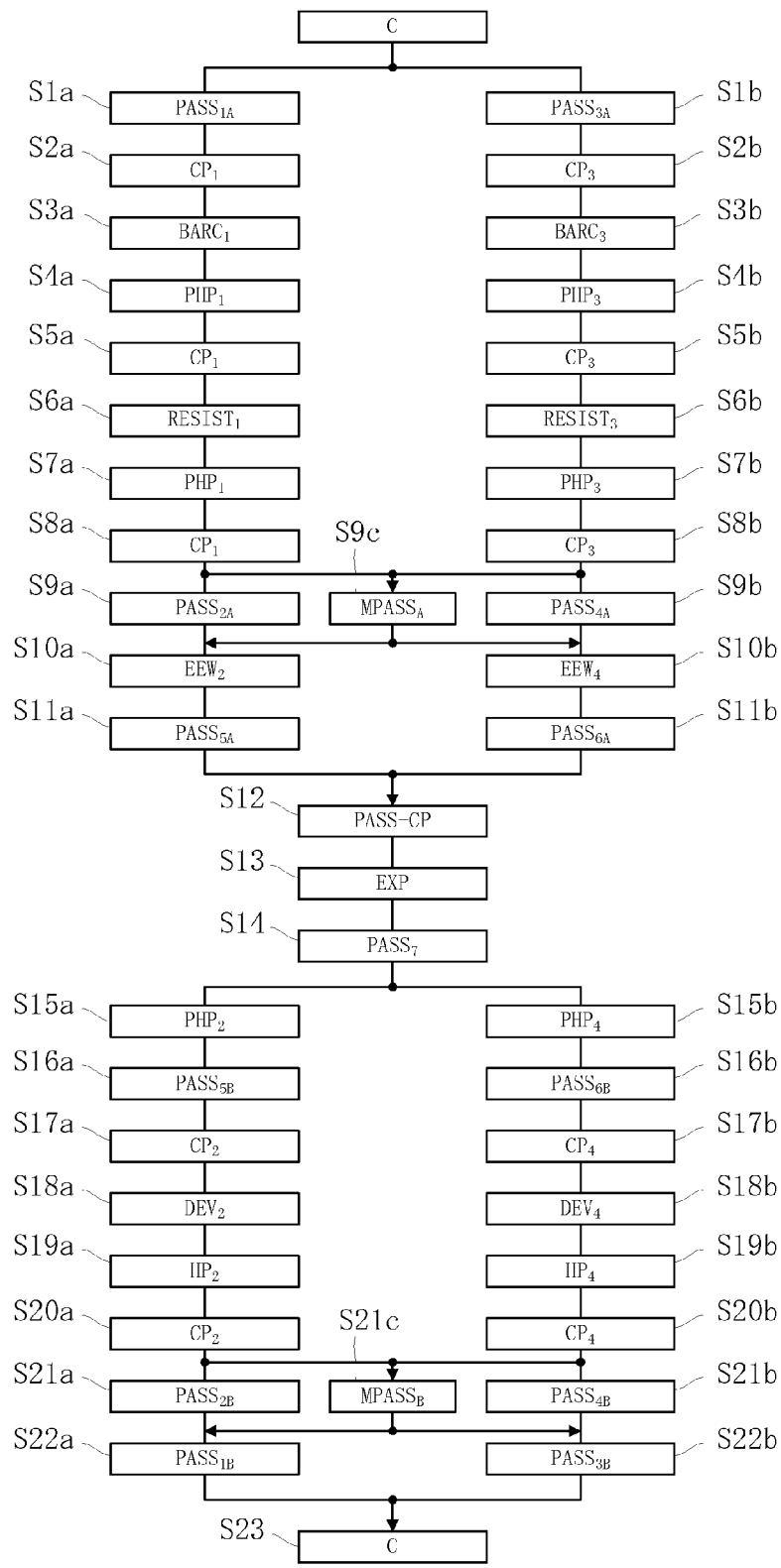
FIG. 15 is a flow chart of a series of treatments of substrates.
Figure 16:
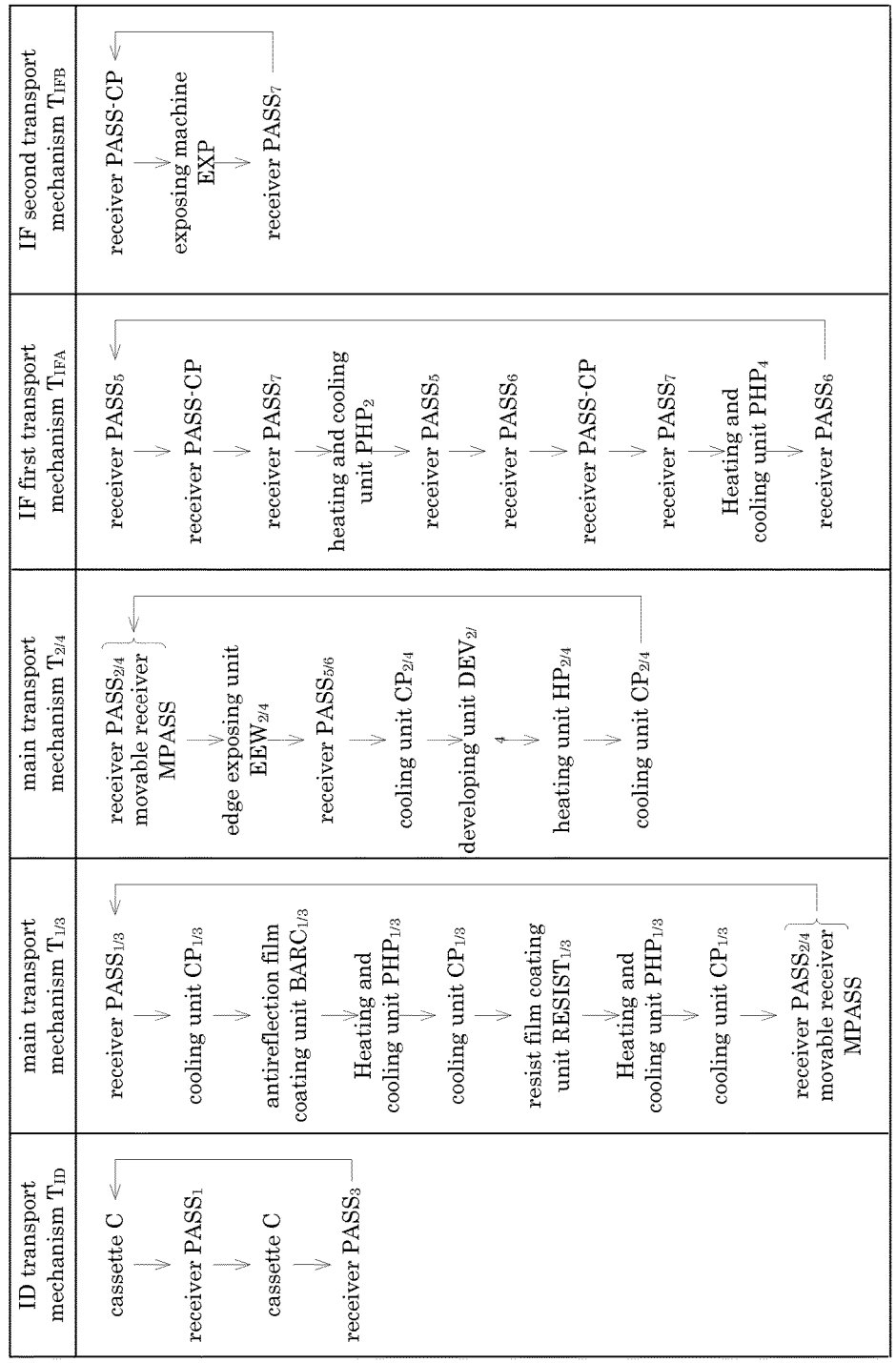
FIG. 16 is a view schematically showing operations repeated by each transport mechanism.

Next, operation of the substrate treating apparatus in this embodiment will be described. The examples of operation according to the various transport paths shown in FIGS. 2 through 4 are realized by combinations of operation of the respective transport mechanisms. Therefore, the following description will be made separately for each transport mechanism. FIG. 15 is a flow chart of a series of treatments of wafers W, indicating the treating units and receivers to which the wafers W are transported in order. FIG. 16 is a view schematically showing operations repeated by each transport mechanism, and specifying an order of treating units, receivers and cassettes accessed by the transport mechanisms.

ID Transport Mechanism $T_{ID}$

The ID transport mechanism $T_{ID}$ moves to a position opposed to one of the cassettes C, holds with the holding arm 25a wafer W to be treated and takes the wafer W out of the cassette C. The ID transport mechanism $T_{ID}$ swivels the holding arm 25, vertically moves the lift shaft 23, moves to a position opposed to the receiver $PASS_1$, and places the wafer W on the receiver $PASS_{1A}$ (which corresponds to step S1a in FIG. 15; only step numbers will be indicated hereinafter). At this time, a wafer W usually is present on the receiver $PASS_{1B}$, and the ID transport mechanism $T_{ID}$ receives this wafer W and stores it in a cassette C (step S23). When there is no wafer W on the receiver $PASS_{1B}$, step S23 is omitted. Then, the ID transport mechanism $T_{ID}$ accesses the cassette C, and transports a wafer W from the cassette C to the receiver $PASS_{3A}$ (step S1b). Here again, if a wafer W is present on the receiver $PASS_{3B}$, the ID transport mechanism $T_{ID}$ will store this wafer W in a cassette C (step S23). The ID transport mechanism $T_{ID}$ repeats the above operation.

This operation of the ID transport mechanism $T_{ID}$ is controlled by the first controller 93. As a result, the wafers W in the cassette C are fed to the story K1, and the wafers W delivered from the story K1 are stored in the cassette C. Similarly, the wafers W in the cassette C are fed to the story K3, and the wafers W delivered from the story K3 are stored in the cassette C.

Main Transport Mechanisms $T_1$, $T_3$

Since operation of the main transport mechanism $T_3$ is substantially the same as operation of the main transport mechanism $T_1$, only the main transport mechanism $T_1$ will be described. That is, operation on the story K1 will be described. The main transport mechanism $T_1$ moves to a position opposed to the receiver $PASS_1$. At this time, the main transport mechanism $T_1$ holds, on one holding arm 57 (e.g. 57b), a wafer W received immediately before from the receiver $PASS_{2B}$. The main transport mechanism $T_1$ places this wafer W on the receiver $PASS_{1B}$ (step S22), and holds the wafer W present on the receiver $PASS_{1A}$ with the other holding arm 57 (e.g. 57a).

The main transport mechanism $T_1$ accesses a predetermined one of the cooling units $CP_1$. There is a different wafer W having already received a predetermined heat treatment (cooling) in the cooling unit $CP_1$. The main transport mechanism $T_1$ holds the different wafer W with the unloaded holding arm 57 (holding no wafer W), takes it out of the cooling unit $CP_1$, and loads into the cooling unit $CP_1$ the wafer W having been received from the receiver $PASS_{1A}$.

Then, the main transport mechanism $T_1$, holding the cooled wafer W, moves to one of the anti-reflection film coating units $BARC_1$. The cooling unit $CP_1$ starts heat treatment (cooling) of the wafer W loaded therein (step S2). The following description assumes that wafers W having received predetermined treatments are present also in the other, different heat-treating units 41 and coating units 31 when the main transport mechanism $T_1$ makes access thereto.

Accessing the anti-reflection film coating unit $BARC_1$, the main transport mechanism $T_1$ takes a wafer W having anti-reflection film formed thereon from the anti-reflection film coating unit $BARC_1$, and places the cooled wafer W on the spin holder 32 of the anti-reflection film coating unit $BARC_1$. Then, the main transport mechanism $T_1$, holding the wafer W having anti-reflection film formed thereon, moves to one of the heating and cooling units $PHP_1$. The anti-reflection film coating unit $BARC_1$ starts treatment of the wafer W placed on the spin holder 32 (step S3).

Specifically, the spin holder 32 spins the wafer W in horizontal posture, the gripper 26 grips one of the nozzles 35, the nozzle moving mechanism 37 moves the gripped nozzle 35 to a position above the wafer W, and the treating solution for anti-reflection film is supplied from the nozzle 35 to the wafer W. The treating solution supplied spreads all over the wafer W, and is scattered away from the wafer W. The cup 33 collects the scattering treating solution. In this way, the treatment is carried out for forming anti-reflection film on the wafer W.

Accessing the heating and cooling unit $PHP_1$, the main transport mechanism $T_1$ takes a wafer W having received heat treatment out of the heating and cooling unit $PHP_1$, and loads the wafer W having anti-reflection film formed thereon into the heating and cooling unit $PHP_1$. Then, the main transport mechanism $T_1$, holding the wafer W taken out of the heating and cooling unit $PHP_1$, moves to one of the cooling units $CP_1$. The heating and cooling unit $PHP_1$ receives a wafer W successively on the two plates 43, to heat the wafer W on one of the plates 43 and then to cool the wafer W on the other plate 43 (step S4).

Having moved to the cooling unit $CP_1$, the main transport mechanism $T_1$ takes a wafer W out of the cooling unit $CP_1$, and loads the wafer W held by the transport mechanism $T_1$ into the cooling unit $CP_1$. The cooling unit $CP_1$ cools the wafer W loaded therein (step S5).

Then, the main transport mechanism $T_1$ moves to one of the resist film coating units $RESIST_1$. The main transport mechanism $T_1$ takes a wafer W having resist film formed thereon from the resist film coating unit $RESIST_1$, and loads the wafer W held by the main transport mechanism $T_1$ into the resist film coating unit $RESIST_1$. The resist film coating unit $RESIST_1$ supplies the resist film material while spinning the wafer W loaded therein, to form resist film on the wafer W (step S6).

The main transport mechanism $T_1$ further moves to one of the heating and cooling units $PHP_1$ and one of the cooling units $CP_1$. The main transport mechanism $T_1$ loads the wafer W having resist film formed thereon into the heating and cooling unit $PHP_1$, transfers a wafer W treated in the heating and cooling unit $PHP_1$ to the cooling unit $CP_1$, and receives a wafer W treated in the cooling unit $CP_1$. The heating and cooling unit $PHP_1$ and cooling unit $CP_1$ carry out predetermined treatments of newly loaded wafers W, respectively (steps S7 and S8).

The main transport mechanism $T_1$, depending on a transport path for the wafer W it is holding, transports the wafer W to the receiver $PASS_2$ or movable receiver MPASS. As a result, this wafer W is fed from the coating block Ba (story K1) to either the story K2 or story K4 of the developing block Bb. The transport path for the wafer W held is set to the processing recipe beforehand.

Specifically, the following action takes place. When transporting the wafer W from the story K1 to the story K2 (corresponding to r1 in FIG. 1), the main transport mechanism $T_1$ moves to the position opposed to the receiver $PASS_2$. Then, the main transport mechanism $T_1$ places the wafer W it is holding on the receiver $PASS_{2A}$ (step S9a).

When transporting the wafer W from the story K1 to the story K4 (corresponding to r3 in FIG. 1), the movable receiver MPASS moves to the height position corresponding to the story K1 (K2), and the main transport mechanism $T_1$ moves to the position opposed to the movable receiver MPASS. Then, the main transport mechanism $T_1$ places the wafer W it is holding on the movable receiver $MPASS_A$ (step S9c). When the wafer W has been placed on the movable receiver $MPASS_A$, the latter moves down to the position corresponding to the destination story K3 (K4).

Then, depending on a transport path for a wafer W to receive from the developing block Bb, the main transport mechanism $T_1$ receives the wafer W present on the receiver $PASS_2$ or movable receiver MPASS. The transport path for this wafer W also is set to the processing recipe beforehand.

Specifically, the following action takes place. When the story K1 is to receive a wafer W fed from the story K2 (corresponding to r1 in FIG. 1), the main transport mechanism $T_1$ receives the wafer W present on the receiver $PASS_{2B}$ (step S21a). When the story K1 is to receive a wafer W fed from the story K4 (corresponding to r3 in FIG. 1), the main transport mechanism $T_1$ receives the wafer W present on the movable receiver $MPASS_B$ (step S21c).

Subsequently, the main transport mechanism $T_1$ accesses the receiver $PASS_1$ again, and repeats the above operation. This operation is controlled by the second controller 94. As a result, the main transport mechanism $T_1$ receives a wafer W from the receiver $PASS_1$ and transports the wafer W to a predetermined treating unit (a cooling unit CP 1 in this embodiment), and takes a treated wafer W from this treating unit. Subsequently, the main transport mechanism $T_1$ transports the wafer W taken out to a different treating unit, and takes a treated wafer W from the different treating unit. In this way, the treatment is carried out in parallel for a plurality of wafers W by transferring a treated wafer W from each treating unit to a new treating unit. Starting with a wafer W first placed on the receiver $PASS_1$, the wafers W are successively transported from the story K1 to the developing block Bb.

When transporting a wafer W from the story K1 to the developing block Bb, and feeding the wafer W to the same story K2 as the story K1, the main transport mechanism $T_1$ places the wafer W on the receiver $PASS_2$. When feeding the wafer W to the story K4 different from the story K1, the main transport mechanism $T_1$ places the wafer W on the movable receiver MPASS.

When receiving a wafer W fed from the developing block Bb, a wafer W fed from the same story K2 as the story K1 is placed on the receiver $PASS_2$, and therefore the main transport mechanism $T_1$ receives the wafer W from the receiver $PASS_2$. Since a wafer W fed from the story K4 different from the story K1 is placed on the movable receiver MPASS, the main transport mechanism $T_1$ receives the wafer W from the movable receiver MPASS. In this way, the main transport mechanism $T_1$ feeds the wafer W received from either the receiver $PASS_2$ or movable receiver MPASS to the ID section 1.

Main Transport Mechanisms $T_2$, $T_4$

Since operation of the main transport mechanism $T_4$ is substantially the same as operation of the main transport mechanism $T_2$, only the main transport mechanism $T_2$ will be described. That is, operation on the story K2 will be described. Depending on a transport path for a wafer W to receive from the coating block Ba, the main transport mechanism $T_2$ receives the wafer W present on the receiver $PASS_2$ or movable receiver MPASS. The transport path for this wafer W also is set to the processing recipe beforehand.

Specifically, the following action takes place. When receiving a wafer W fed from the story K1 (corresponding to r1 in FIG. 1), the main transport mechanism $T_2$ receives the wafer W present on the receiver $PASS_2$ (step S9a). When receiving a wafer W fed from the story K3 (corresponding to r4 in FIG. 1), the main transport mechanism $T_2$ receives the wafer W present on the movable receiver $MPASS_A$ (step S9c).

At this time, the main transport mechanism $T_2$ is holding a wafer W received from a cooling unit $CP_2$ accessed immediately before. The main transport mechanism $T_2$ places this wafer W on the receiver $PASS_2$ or movable receiver MPASS, depending on a transport path for the wafer W. Specifically, when the wafer W is to be transported from the story K2 to the story K1, the main transport mechanism $T_2$ places the wafer W on the receiver $PASS_2$. When the wafer W is to be transported from the story K2 to the story K3, the main transport mechanism $T_2$ places the wafer W on the movable receiver MPASS. In this way, the wafer W is fed from the story K2 to either the story K1 or story K3 of the coating block Ba.

Specifically, the following action takes place. When transporting the wafer W from the story K2 to the story K1 (corresponding to r1 in FIG. 1), the main transport mechanism $T_2$ places the wafer W it is holding on the receiver $PASS_{2B}$ (step S21a). When transporting the wafer W from the story K2 to the story K3 (corresponding to r4 in FIG. 1), the main transport mechanism $T_2$ places the wafer W it is holding on the movable receiver $MPASS_B$ (step S21c). When the wafer W has been placed on the movable receiver MPASS, the latter moves down to the position corresponding to the destination story K3 (K4).

After the substrate transport in step S9a or S9c, the main transport mechanism $T_2$ accesses the edge exposing unit $EEW_2$. Then, the main transport mechanism $T_2$ receives a wafer W having undergone a predetermined treatment in the edge exposing unit $EEW_2$, and loads the cooled wafer W into the edge exposing unit $EEW_2$. While spinning the wafer W loaded therein, the edge exposing unit $EEW_2$ irradiates peripheral regions of the wafer W with light from the light emitter not shown, thereby exposing the peripheral regions of the wafer W (step S10).

The main transport mechanism $T_2$, holding the wafer W received from the edge exposing unit $EEW_2$, accesses the receiver $PASS_5$. The main transport mechanism $T_2$ places the wafer W on the receiver $PASS_{5A}$ (step S11), and holds a wafer W present on the receiver $PASS_{5B}$ (step S16).

The main transport mechanism $T_2$ moves to one of the cooling units $CP_2$, and replaces a wafer W in the cooling unit $CP_2$ with the wafer W held by the main transport mechanism $T_2$. The main transport mechanism $T_2$ holds the wafer W having received cooling treatment, and accesses one of the developing units $DEV_2$. The cooling unit $CP_2$ starts treatment of the newly loaded wafer W (step S17).

The main transport mechanism $T_2$ takes a developed wafer W from the developing unit $DEV_2$, and places the cooled wafer W on the spin holder 77 of the developing unit $DEV_2$. The developing unit $DEV_2$ develops the wafer W placed on the spin holder 77 (step S18). Specifically, while the spin holder 77 spins the wafer W in horizontal posture, the developer is supplied from one of the slit nozzles 81a to the wafer W, thereby developing the wafer W.

The main transport mechanism $T_2$ holds the developed wafer W, and accesses one of the heating units $HP_2$. The main transport mechanism $T_2$ takes a wafer W out of the heating unit $HP_2$, and loads the wafer W it is holding into the heating unit $HP_2$. Then, the main transport mechanism $T_2$ transports the wafer W taken out of the heating unit $HP_2$ to one of the cooling units $CP_2$, and takes out a wafer W already treated in this cooling unit $CP_2$. The heating unit $HP_2$ and cooling unit $CP_2$ carry out predetermined treatments for the newly loaded wafers W, respectively (steps S19 and S20).

Subsequently, the main transport mechanism $T_2$ accesses the receiver $PASS_2$ and/or movable receiver MPASS again, and repeats the above operation. This operation is controlled by the third controller 95. As a result, the wafers W are forwarded to the receiver $PASS_{5A}$ in the order of receipt from the receiver $PASS_{2A}$ or movable receiver $MPASS_A$. Similarly, the wafers W are forwarded to the receiver $PASS_{2B}$ or movable receiver $MPASS_B$ in the order in which they are placed on the receiver $PASS_{5B}$.

At this time, the wafers W are fed through the receiver $PASS_2$ for transport to the same story K1 as the story K2. The wafers W are fed through the movable receiver MPASS for transport to the story K4 different from the story K2.

IF Transport Mechanisms $T_{IF}$—IF First Transport Mechanism $T_{IFA}$

IF first transport mechanism $T_{IFA}$ accesses the receiver $PASS_5$, and receives the wafer W present on the receiver $PASS_{5A}$ (step S11a). IF first transport mechanism $T_{IFA}$, holding the wafer W received, moves to the receiver PASS-CP, and loads the wafer W on the receiver PASS-CP (step S12).

Next, IF first transport mechanism $T_{IFA}$ receives a wafer W from the receiver $PASS_7$ (step S14), and moves to a position opposed to one of the heating and cooling units $PHP_2$. IF first transport mechanism $T_{IFA}$ takes a wafer W having received post-exposure baking treatment (PEB) treatment from the heating and cooling unit $PHP_2$, and loads the wafer W received from the receiver $PASS_7$ into the heating and cooling unit $PHP_2$. The heating and cooling unit $PHP_2$ carries out heat treatment for the newly loaded wafer W (step S15a).

IF first transport mechanism $T_{IFA}$ transports the wafer W taken out of the heating and cooling unit $PHP_2$ to the receiver $PASS_{SB}$. Subsequently, IF first transport mechanism $T_{IFA}$ transports a wafer W from the receiver $PASS_{6A}$ to the receiver PASS-CP (Step S11b, S12). Next, IF first transport mechanism $T_{IFA}$ transports a wafer W from the receiver $PASS_7$ to one of the heating and cooling units $PHP_4$. At this time, IF first transport mechanism $T_{IFA}$ takes out a wafer W having received the post-exposure baking treatment (PEB) treatment in the heating and cooling unit $PHP_4$, and places the wafer W on the receiver $PASS_{6B}$ (steps S14, S15b, S16b).

Subsequently, IF first transport mechanism $T_{IFA}$ accesses the receiver $PASS_5$ again and repeats the above operation. This operation is controlled by the sixth controller 98.

IF Transport Mechanisms $T_{IF}$—IF Second Transport Mechanism $T_{IFB}$

IF second transport mechanism $T_{IFB}$ takes a wafer W out of the receiver PASS-CP, and transports it to the exposing machine EXP. Then, IF second transport mechanism $T_{IFB}$ receives an exposed wafer W from the exposing machine EXP, and transports it to the receiver PASS$_7$ (step S13).

Subsequently, IF second transport mechanism T$_{IFB}$ accesses the receiver PASS-CP again and repeats the above operation.

As described above, the substrate treating apparatus according to the first embodiment includes the movable receiver MPASS disposed between the adjoining coating block Ba and developing block Bb to be vertically movable between the upper story K1 (K2) and lower story K3 (K4). This allows wafers W to be transported between different stories of the coating block Ba and developing block Bb.

Since the range of vertical movement of the movable receiver MPASS covers all the stories (the upper story and lower story in this embodiment) of the treating blocks Ba and Bb, each of the stories K1 and K3 of the coating block Ba can transport wafers W to and from all the stories K2 and K4 of the developing block Bb. Conversely, each of the stories K2 and K4 of the developing block Bb can transport wafers W to and from all the stories K1 and K3 of the coating block Ba. That is, the movable receiver MPASS allows wafers W to be transported through four paths r1-r4 between the respective stories of the treating blocks Ba and Bb. When the transport directions are considered, the number of paths is eight.

Since wafers W can be transported flexibly between the treating blocks Ba and Bb as described above, even when one of the main transport mechanisms T falls into an abnormal state, the wafers W can be transported through the transport paths which do not include the abnormal main transport mechanism T. A series of treatments is carried out for the wafers W by efficiently operating the normal main transport mechanisms T and the treating units. This can prevent a significant reduction in the throughput of this apparatus.

Since wafers W can be transported flexibly between the treating blocks Ba and Bb, a flexible selection can be made from among the transport paths for the wafers W of the entire apparatus described with reference to FIGS. 2 to 4. This enables a comparison of the quality of treatment between the stories K1 and K3 of the coating block Ba, and between the stories K2 and K4 of the developing block Bb.

Since the receivers PASS$_2$ and PASS$_4$ are fixedly provided between the treating blocks Ba and Bb, wafers W can be transported between the same stories K1 and K2 and between the same stories K3 and K4 of the treating blocks Ba and Bb. The burden and amount of movement of the movable receiver MPASS can be reduced by using the movable receiver MPASS exclusively for transporting wafers W between different stories, and using the receivers PASS$_2$ and PASS$_4$ exclusively for transporting wafers W between the same stories. As a result, wafers W can be transported smoothly even between the different stories of the treating blocks Ba and Bb. The movable receiver MPASS can also be controlled with increased ease.

Second Embodiment

The second embodiment of this invention will be described with reference to the drawings. In the second embodiment, the movable receiver MPASS is omitted from the substrate treating apparatus described in the first embodiment, and the construction of the main transport mechanisms T$_2$ and T$_4$ in the developing block Bb described in the first embodiment has been changed. Thus, the following description will be made centering on main transport mechanisms T$_{2M}$ and T$_{4M}$ of the second embodiment.

Figure 17:
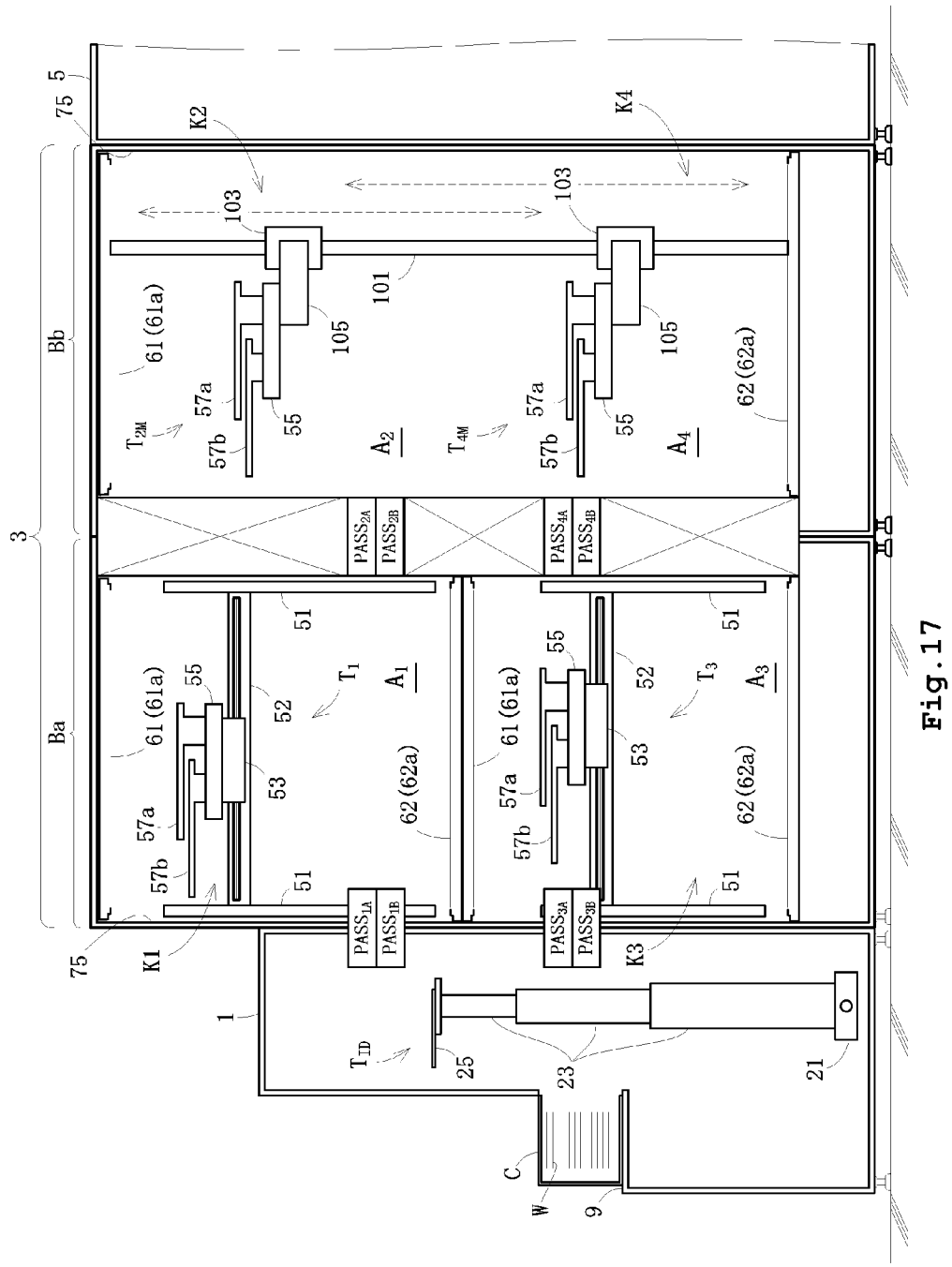
FIG. 17 is a view in vertical section of transporting spaces in a substrate treating apparatus in a second embodiment.

FIG. 17 is a view in vertical section of each transporting space in the substrate treating apparatus according to the second embodiment. As seen, there is no first blowout unit 61 or exhaust unit 62 between the transporting spaces A$_2$ and A$_4$ on the stories K2 and K4 of the developing block Bb. Therefore, the transporting space A$_2$ and transporting space A$_4$ are in communication.

Both the main transport mechanisms T$_{2M}$ and T$_{4M}$ are vertically movably supported by a common strut 101. The main transport mechanism T$_{2M}$ is disposed over the main transport mechanism T$_{4M}$. The strut 101 extends vertically from the upper end of the transporting space A$_2$ to the lower end of the transporting space A$_4$. Each of the main transport mechanisms T$_{2M}$ and T$_{4M}$ includes a lift member 103, a base 105, a turntable 55 and two holding arms 57a and 57b. The lift member 103 is attached to the strut 101 to be vertically movable along the strut 101. The base 105 is connected to the lift member 103. The turntable 55 is supported by the base 103 to be rotatable about a vertical axis. The two holding arms 57a and 57b are horizontally extendible and retractable relative to the turntable 55.

The main transport mechanism T$_{2M}$ transports wafers W to and from the treating units arranged on the story K2 and the receivers PASS$_2$ and PASS$_5$. Further, the main transport mechanism T$_{2M}$ can descend to the story K4 to transport wafers W to and from the receiver PASS$_4$. At this time, the main transport mechanism T$_{4M}$ moves to a lower position on the story K4 to avoid interference with the main transport mechanism T$_{2M}$. Thus, the main transport mechanism T$_{2M}$ is constructed vertically movable between the stories K2 and K4 in the developing block Bb to transfer wafers W to and from the main transport mechanisms T$_1$ and T$_3$ on the stories K1 and K3 of the adjoining coating block Ba.

Similarly, the main transport mechanism T$_{4M}$ transports wafers W to and from the treating units arranged on the story K4 and the receivers PASS$_4$ and PASS$_E$. Further, the main transport mechanism T$_{4M}$ can ascend to the story K2 to transport wafers W to and from the receiver PASS$_2$. At this time, the main transport mechanism T$_{2M}$ moves to an upper position on the story K2 to avoid interference with the main transport mechanism T$_{4M}$. Thus, the main transport mechanism T$_{4M}$ also is constructed vertically movable between the stories K2 and K4 in the developing block Bb to transfer wafers W to and from the main transport mechanisms T$_1$ and T$_3$ on the stories K1 and K3 of the adjoining coating block Ba.

With the main transport mechanism T$_{2M}$ transporting wafers W to and from the receiver PASS$_4$, the wafers W can be transported between the story K2 and story K3 (corresponding to r4 in FIG. 1). With the main transport mechanism T$_{4M}$ transporting wafers W to and from the receiver PASS$_2$, the wafers W can be transported between the story K1 and story K4 (corresponding to r3 in FIG. 1).

Thus, with the substrate treating apparatus according to the second embodiment, the main transport mechanism T$_{2M}$ on the story K2 can transfer wafers W to and from the main transport mechanism T$_1$ on the same story K1 through the receiver PASS$_2$, and to and from the main transport mechanism T$_3$ on the different story K3 through the receiver PASS$_4$. Similarly, the main transport mechanism T$_{4M}$ on the story K4 can transfer wafers W to and from the main transport mechanism T$_3$ on the same story K3 through the receiver PASS$_4$, and to and from the main transport mechanism T$_1$ on the different story K1 through the receiver PASS$_2$. Therefore, as in the first embodiment, wafers W can be transported through four paths r1-r4 between the respective stories of the treating blocks Ba and Bb. When the transport directions are considered, the number of paths is eight.

Thus, the apparatus in the second embodiment, as in the first embodiment, allows transport paths R for transporting wafers W to be selected and changed in various ways, to carry out a series of treatments for the wafers W conveniently.

The main transport mechanisms $T_{2M}$ and $T_{4M}$ transfer wafers W to and from the main transport mechanisms $T_1$ and $T_3$ through the fixed receivers $PASS_2$ and $PASS_4$. This construction does not require, besides the four main transport mechanisms $T_1$-$T_4$, any additional mechanism for moving wafers W, such as the movable receiver MPASS described in the first embodiment. It is therefore possible to simplify the construction of the apparatus and the transport control of wafers W.

Figure 18:
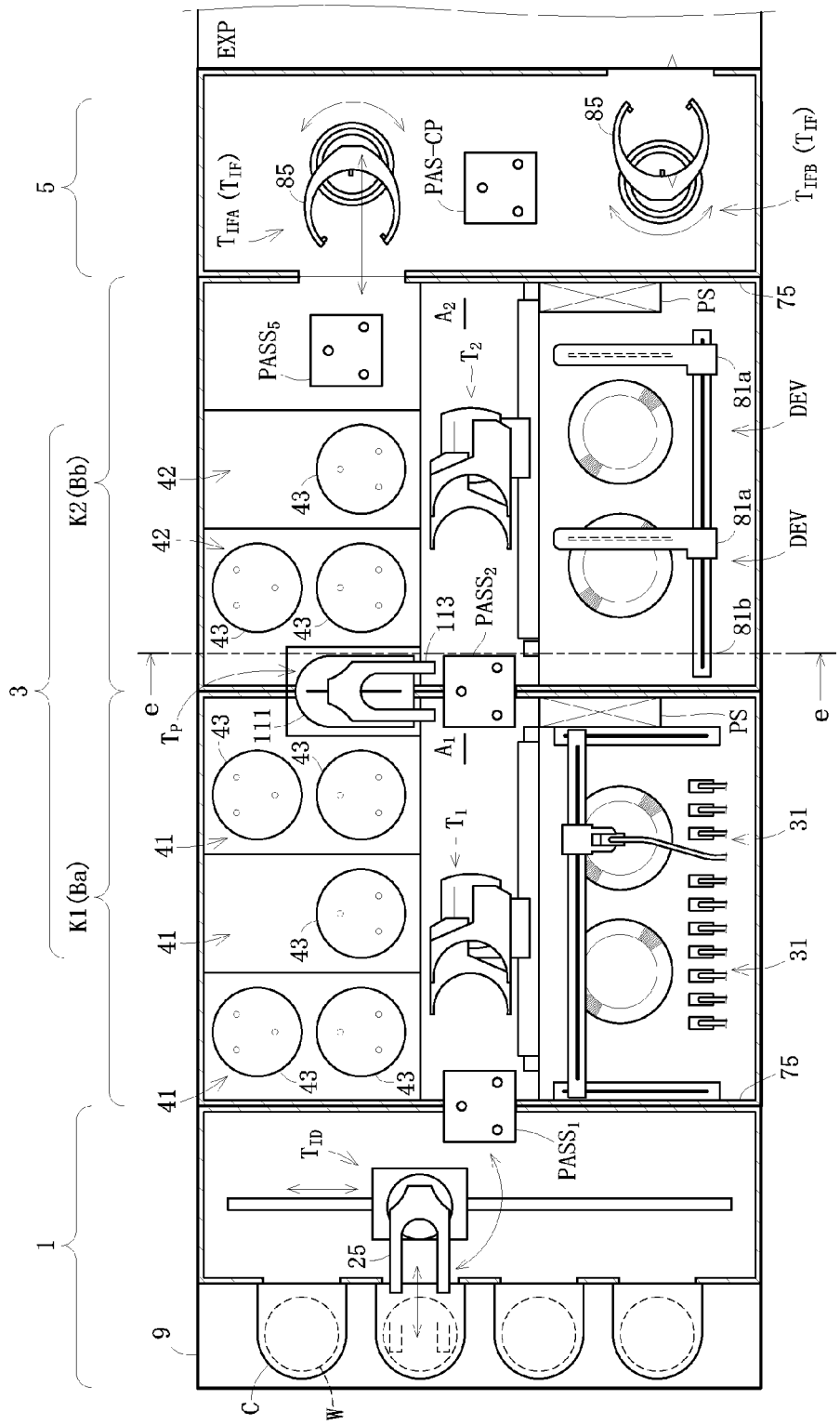
FIG. 18 is a plan view of a modified substrate treating apparatus.
Figure 19:
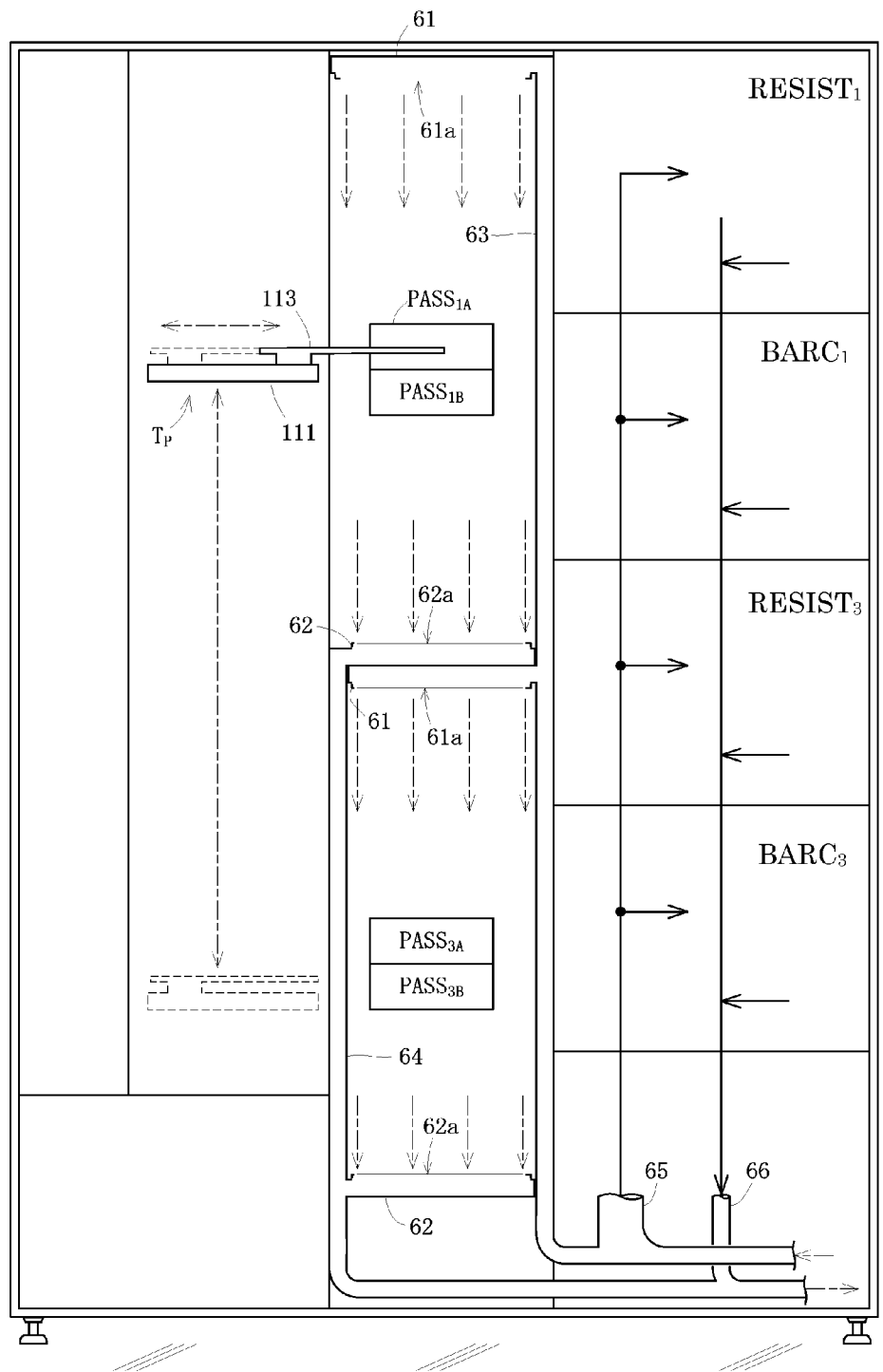
FIG. 19 is a view in vertical section taken on line e-e of FIG. 18.

This invention is not limited to the foregoing embodiments, but may be modified as follows:

(1) The first embodiment described above provides the movable receiver MPASS, but the invention is not limited to this. Reference is made to FIGS. 18 and 19. FIG. 18 is a plan view of a modified substrate treating apparatus. FIG. 19 is a view in vertical section taken on line e-e of FIG. 18. Like reference numerals are used to identify like parts which are the same as in the first embodiment and will not be described again.

As shown in FIGS. 18 and 19, a receiver transport mechanism $T_P$ is disposed laterally of the receivers $PASS_2$ and $PASS_4$. The receiver transport mechanism $T_P$ transports wafers W between the receivers $PASS_2$ and $PASS_4$. The receiver transport mechanism $T_P$ has a lift base 111 and a holding arm 113. The lift base 111 is vertically movable by a drive mechanism (not shown) between the height positions of the receivers $PASS_2$ and $PASS_4$. The holding arm 113 is horizontally extendible and retractable relative to the lift base 111 for holding wafers W.

The receiver transport mechanism $T_P$ transports to the receiver $PASS_4$ a wafer W placed on the receiver $PASS_2$ by the main transport mechanism $T_1$ on the story K1. Then, the main transport mechanism $T_4$ on the story K4 can receive this wafer W. Conversely, the receiver transport mechanism $T_P$ transports to the receiver $PASS_2$ a wafer W placed on the receiver $PASS_4$ by the main transport mechanism $T_4$. Then, the main transport mechanism $T_1$ on the story K1 can receive this wafer W. Thus, with the receiver transport mechanism $T_P$ transporting wafers W between the receiver $PASS_2$ and receiver $PASS_4$, the wafers W can be transported between the story K1 and story K4 (transport path r3 in FIG. 1). When transporting wafers W between the same stories, the receiver transport mechanism $T_P$ is not required to transport the wafers W between the receiver $PASS_2$ and $PASS_4$.

The receivers' transport mechanism $T_P$ transports to the receiver $PASS_2$ a wafer W placed on the receiver $PASS_4$ by the main transport mechanism $T_3$ on the story K3. Then, the main transport mechanism $T_2$ on the story K2 can receive this wafer W. Conversely, the receivers' transport mechanism $T_P$ transports to the receiver $PASS_4$ a wafer W placed on the receiver $PASS_2$ by the main transport mechanism $T_2$. Then, the main transport mechanism $T_3$ on the story K3 can receive this wafer W. Thus, with the receivers' transport mechanism $T_P$ transporting wafers W between the receiver $PASS_2$ and receiver $PASS_4$, the wafers W can be transported between the story K2 and story K3 (transport path r4 in FIG. 1).

(2) The first embodiment described above provides the receivers $PASS_2$ and $PASS_4$, but the invention is not limited to this. A change may be made to transport wafers W between the same stories through the movable receiver MPASS. Such modification can omit the receivers $PASS_2$ and $PASS_4$.

(3) In the second embodiment described above, each of the main transport mechanisms $T_{2M}$ and $T_{4M}$ can transport wafers W to and from both the receivers $PASS_2$ and $PASS_4$. The invention is not limited to this construction. For example, each of the main transport mechanisms $T_1$ and $T_3$ of the coating block Ba may be modified to have the same construction as the main transport mechanism $T_{2M}$ or $T_{4M}$, to transport wafers W to and from both the receivers $PASS_2$ and $PASS_4$. Further, each of the main transport mechanism $T_{2M}$ and $T_{4M}$ may be modified to have the same construction as the main transport mechanism $T_2$ or $T_4$ in the first embodiment, so that only each main transport mechanism $T_1$ or $T_3$ of the coating block Ba may be able to transport wafers W to and from both the receivers $PASS_2$ and $PASS_4$.

(4) In the second embodiment described above, each of the main transport mechanisms $T_{2M}$ and $T_{4M}$ of the developing block Bb can transport wafers W to and from both the receivers $PASS_2$ and $PASS_4$. The invention is not limited to this construction. The construction may be modified such that, for example, while the main transport mechanism T2M can transport wafers W to and from both the receivers $PASS_2$ and $PASS_4$, the main transport mechanism $T_{4M}$ can transport wafers W to and from only the receiver $PASS_4$ and not the receiver $PASS_2$. In this case also, wafers W can be transported between the story K2 and story K3. Conversely, the construction may be modified such that, while the main transport mechanism $T_{4M}$ can transport wafers W to and from both the receivers $PASS_2$ and $PASS_4$, the main transport mechanism $T_{2M}$ cannot transport wafers W to and from the receiver $PASS_4$. In this case also, wafers W can be transported between the story K4 and story K1.

(5) In the second embodiment described above, each of the main transport mechanisms $T_{2M}$ and $T_{4M}$ is constructed vertically movable. The invention is not limited to this. As long as both the receivers $PASS_2$ and $PASS_4$ are accessible, each of the main transport mechanisms $T_{2M}$ and $T_{4M}$ may be modified to be a vertically extendible and contractible mechanism.

(6) In each embodiment described above, each treating block Ba or Bb has two stories. The invention is not limited to this. For example, each treating block Ba or Bb may be modified to have three or more stories.

Even where three or more stories are arranged vertically, at least one transport path r that can transport wafers W between different stories of the coating block Ba and developing block Bb will serve the purpose. Take the construction in the first embodiment, for example. Where each of the treating blocks Ba and Bb is divided into three or more stories, what is required is just to construct the movable receiver MPASS to be vertically movable between two or more stories. It is possible, of course, to modify so that each story of the coating block Ba may transfer wafers W to and from all the stories of the developing block Bb. Specifically, the movable receiver MPASS may be constructed vertically movable to all the stories.

Where the construction of the second embodiment has each treating block Ba or Bb divided into the three or more stories, each of the main transport mechanisms $T_{2M}$ and $T_{4M}$ may be constructed vertically movable to two or more stories in the developing block Bb. It is possible, of course, to modify so that each of the main transport mechanisms $T_{2M}$ and $T_{4M}$ may be vertically movable to all the stories.

(7) In each embodiment described above, the treating section 3 includes two treating blocks Ba and Bb in juxtaposition. The invention is not limited to this construction. For example, the treating section 3 may be modified to include three or more treating blocks.

Where three or more treating blocks are juxtaposed, the treating blocks adjoin in two or more locations. However, wafers W may be transported between different stories in at least one of such locations. It is possible, of course, to modify so that wafers W be transported between different stories in all the locations where the treating blocks adjoin.

(8) In each embodiment described above, the treating blocks are exemplified by the coating block Ba and developing block Bb. The invention is not limited to this. A different treating block may be employed as appropriate, for performing other treatment for wafers W such as cleaning Depending on the type of treatment given by the treating section 3, it is possible to omit the exposing machine EXP provided separately from and adjacent the subject apparatus.

(9) The constructions of each embodiment and each modification described above may be combined as appropriate.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
a first treating block; and
a second treating block disposed adjacent to the first treating block;
each of the first treating block and the second treating block including a plurality of stories arranged vertically;
each of the plurality of stories including:
treating units for treating substrates; and
a main transport mechanism for transporting the substrates to and from the treating units;
wherein the substrates are transportable between the plurality of stories of the first treating block and the plurality of stories of the second treating block at same heights as corresponding stories of the first treating block; and
wherein the substrates are transportable between the plurality of stories of the first treating block and the plurality of stories of the second treating block at different heights from corresponding stories of the first treating block.

2. The apparatus according to claim 1 further comprising:
a plurality of fixed receivers provided for respective stories, the plurality of fixed receivers being arranged between the first treating block and the second treating block; and
a receiver transport mechanism for transporting the substrates between the plurality of fixed receivers.

3. The apparatus according to claim 2 wherein:
the main transport mechanisms on the respective stories are capable of transporting the substrates to and from the plurality of fixed receivers provided for same stories as the main transport mechanisms; and
the receiver transport mechanism is vertically movable between height positions of the plurality of fixed receivers provided for the respective stories.

4. The apparatus according to claim 1 wherein:
each of the first treating block and the second treating block includes:
an upper story; and
a lower story located below the upper story;
wherein the substrates are transportable between the upper story of the first treating block and the upper story of the second treating block, and between the lower story of the first treating block and the lower story of the second treating block; and
the substrates are transportable between the upper story of the first treating block and the lower story of the second treating block, and between the lower story of the first treating block and the upper story of the second treating block.

* * * * *